United States Patent [19]
Stehlik

[11] Patent Number: 5,517,529
[45] Date of Patent: May 14, 1996

US005517529A

[54] UHF/L-BAND MONOLITHIC DIRECT DIGITAL RECEIVER

[75] Inventor: Roy R. Stehlik, Columbia, Md.

[73] Assignee: Westinghouse Electric Corp., Pittsburgh, Pa.

[21] Appl. No.: 138,905

[22] Filed: Oct. 18, 1993

[51] Int. Cl.$^6$ .................... H03K 9/00; H04L 27/06; H04L 27/14; H04L 27/22
[52] U.S. Cl. ............... 375/316; 329/314; 455/188.2; 364/724.1
[58] Field of Search ................ 375/75, 103, 316, 375/350, 346, 324, 340, 343; 455/188.2, 182.3, 192.3, 189.2, 190.1; 364/724.1, 490; 329/311, 314

[56] References Cited

U.S. PATENT DOCUMENTS

| | | | |
|---|---|---|---|
| 4,020,332 | 4/1977 | Crochiere et al. | 364/724.1 |
| 4,709,270 | 11/1987 | Mehrgardt | 358/188 |
| 4,972,357 | 11/1990 | Morel | 364/724.1 |
| 5,043,933 | 8/1991 | Boutaud et al. | 364/724.1 |
| 5,051,981 | 9/1991 | Kline | 370/32.1 |
| 5,079,734 | 1/1992 | Riley | 364/724.1 |
| 5,325,318 | 6/1994 | Harris | 364/724.1 |

OTHER PUBLICATIONS

Eugene B. Hogenaur, "An Economical Class of Digital Filters For Decimation and Interpolation," IEEE Transactions on Acoustics, Speech, and Signal Processing, vol. ASSP-29, No. 2, Apr. 1981, pp. 155–162.

Wilson et al., "A Single–Chip VHF and UHR Receiver for Radio Paging," IEEE Journal of Solid State Circuits, vol. 26 No. 12 Dec. 1991. pp. 1944–1950.

*Primary Examiner*—Stephen Chin
*Assistant Examiner*—Bryan E. Webster

[57] ABSTRACT

A monolithic direct digital UHF/L-Band receiver for receiving and processing a UHF/L-Band analog signal and deriving digitized samples, the receiver operating in a tuning frequency range centered at a center frequency and having a baseband frequency, a lower bandedge frequency, and an upper bandedge frequency. The receiver comprises: a substrate; an analog-to-digital converter, mounted on the substrate, for digitally sampling at a sample rate the UHF/L-Band analog signal; a heterodyning circuit, coupled to the analog-to-digital converter and mounted on the substrate, for mixing the digitally sampled signal with a mixing signal thereby shifting the center frequency of the tuning frequency range of the sampled signal to the baseband frequency; and means, coupled to the heterodyning circuit and mounted on the substrate, for decimation filtering and decimating the mixed signal to obtain a second sample rate lower than the sample rate.

29 Claims, 14 Drawing Sheets

*FIG.3A*
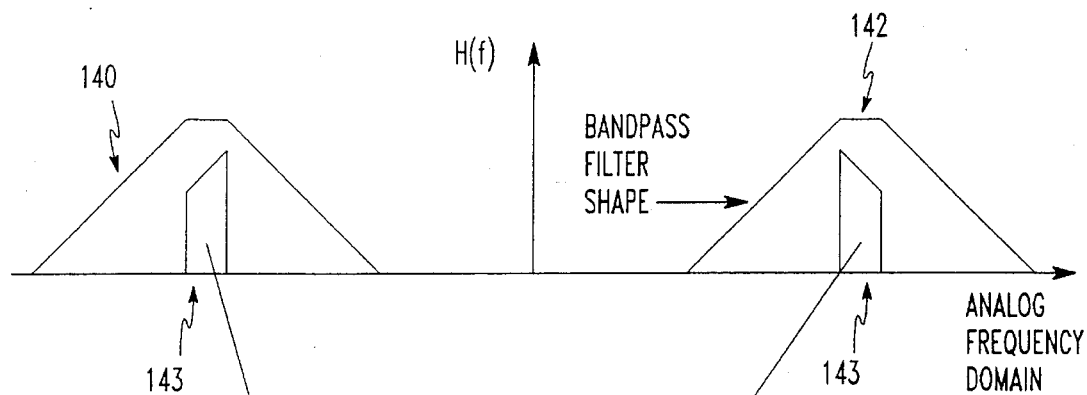
*FIG.3B*
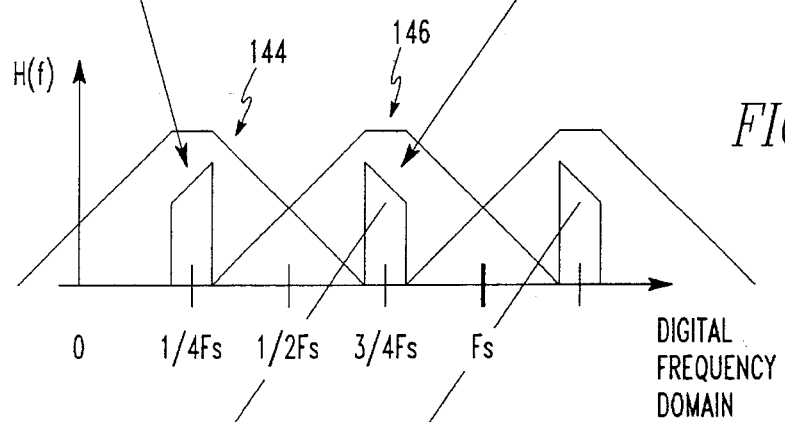
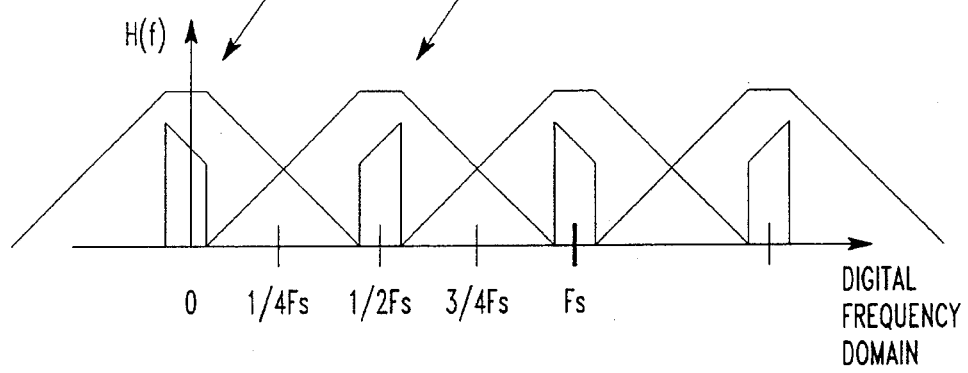
*FIG.3C*

$$y(k) = y_I(k) + jy_Q(k)$$

$$= x(k)e^{-j2\pi(3/4)k}$$

$$= x(k)\cos(2\pi(3/4)k) - jx(k)\sin(2\pi(3/4)k)$$

| k MOD. 4 | $y_I(k)$ | $y_Q(k)$ |
|---|---|---|
| 0 | X(K) | 0 |
| 1 | 0 | X(K) |
| 2 | -X(K) | 0 |
| 3 | 0 | -X(K) |

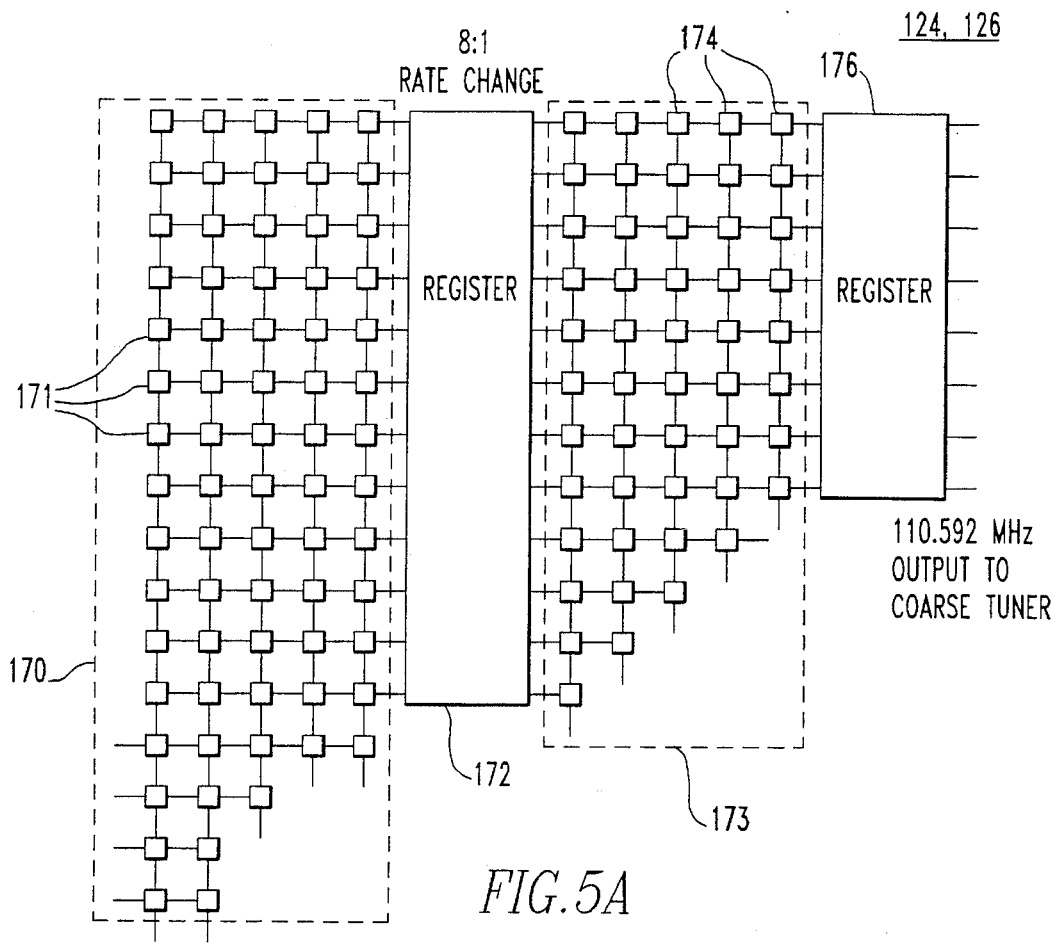
FIG.5A
884.736 MHz
INPUT FROM A/D
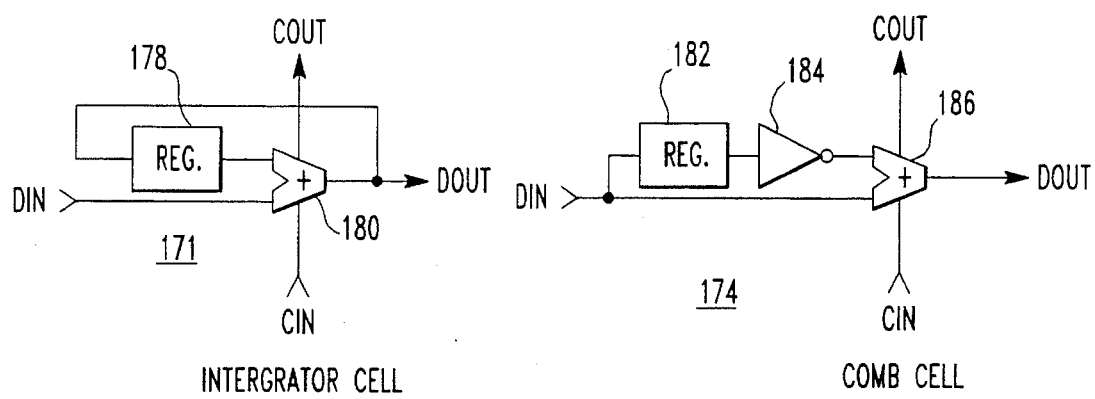
FIG.5B
INTERGRATOR CELL
FIG.5C
COMB CELL

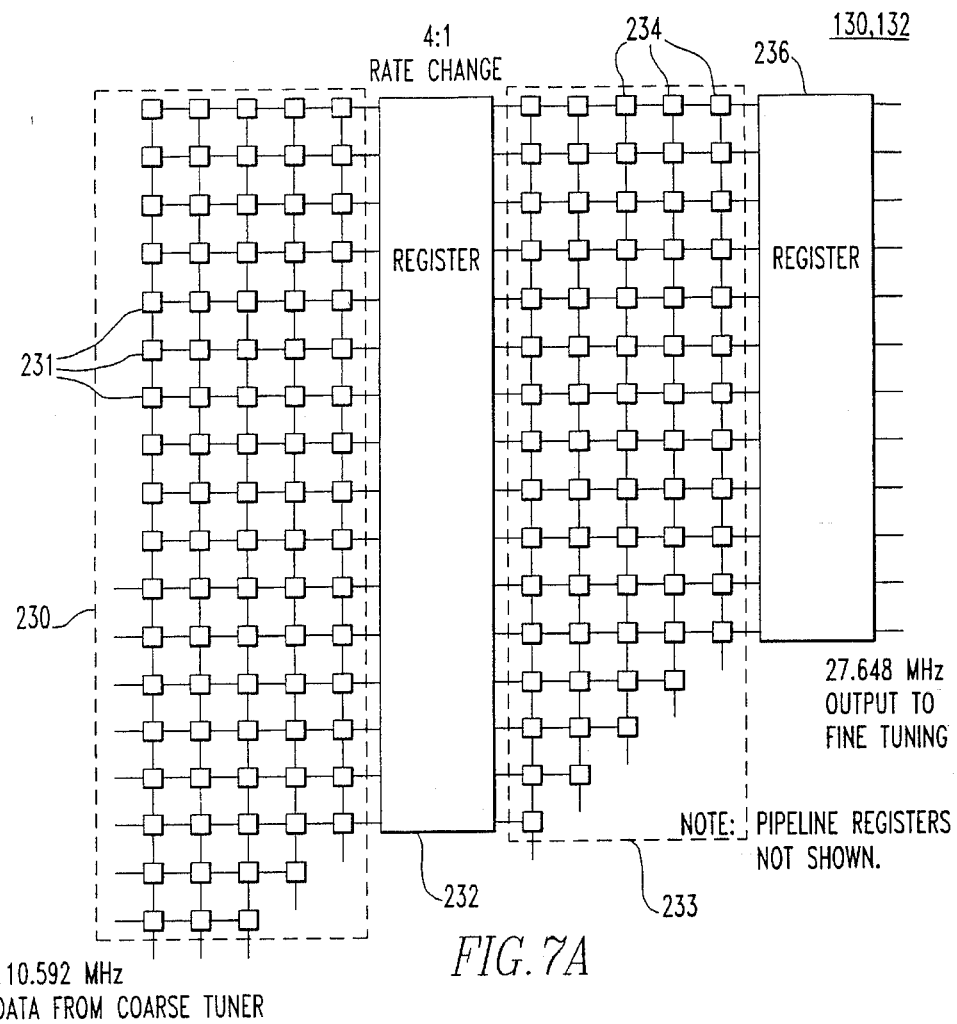
FIG. 7A
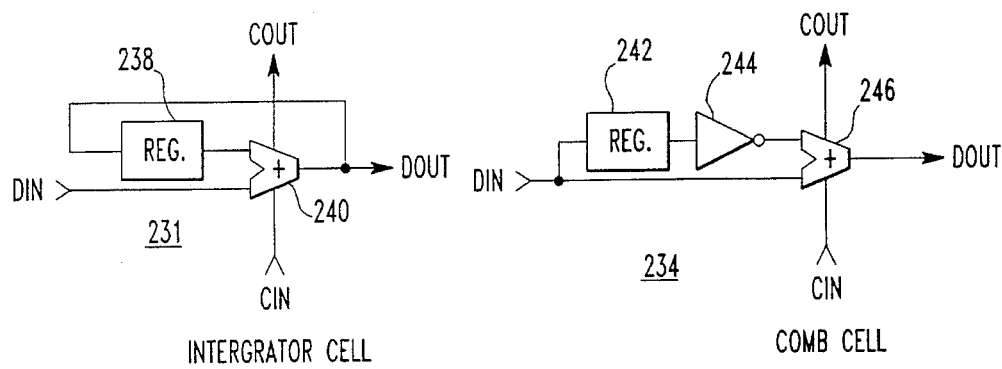
FIG. 7B
FIG. 7C

TYPICAL
INTEGRATOR
CELL

TYPICAL
COMB
CELL

UHF/L-BAND MONOLITHIC DIRECT DIGITAL RECEIVER

BACKGROUND OF THE INVENTION

1. Field of the Invention

The present invention relates to Ultra-High Frequency ("UHF")/L-Band analog signal receivers. More particularly, the invention relates to monolithic integrated circuit direct digital receivers for receiving and processing analog signals in the UHF/L-Band range.

2. Description of Related Art

In various signal processing applications, it is necessary to receive analog signals and to derive a digitized baseband signal directly from a radio frequency ("RF") analog signal. At present, it is known in the art how to obtain direct digitization of RF signals using elements which exist separately. However, implementing a complete digital radio receiver on a monolithic integrated circuit, which has been a goal of receiver designers for some time, is not presently known in the art.

Certain technology limitations have prevented implementing a direct digital UHF/L-Band receiver on a monolithic integrated circuit. The fundamental stumbling block has been the performance of the analog-to-digital converter. Another stumbling block are limitations as to digital logic, i.e., processing the signal once it is digitized. If these stumbling blocks are overcome, however, one can implement a lower cost, complete direct digital radio receiver on a monolithic integrated circuit, which will have a lower parts count than a conventional analog receiver. Moreover, such a complete monolithic receiver will be digital and will thus have the advantages associated with digital circuitry, e.g., improved manufacturability, testability, predictability, etc. Finally, such a complete monolithic receiver will have improved selectivity compared to a conventional analog receiver, because the filtering employed in such a monolithic receiver is digitally implemented and thus capable of better performance than analog filters.

Therefore, a need exists for a complete, monolithic integrated circuit direct digital radio receiver for receiving UHF/L-Band frequencies and deriving digitized samples at baseband.

SUMMARY OF THE INVENTION

Accordingly, the present invention is directed to a monolithic integrated circuit direct digital UHF/L-Band receiver that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the apparatus and method particularly pointed out in the written description and claims hereof, as well as the appended drawings.

To achieve these and other advantages and in accordance with the purpose of the invention, as embodied and broadly described herein, the invention is a monolithic direct digital UHF/L-Band receiver for receiving and processing a UHF/L-Band analog signal and deriving digitized samples, the receiver operating in a tuning frequency range centered at a center frequency and having a baseband frequency, a lower bandedge frequency, and an upper bandedge frequency. The receiver comprises a substrate; an analog-to-digital converter, mounted on the substrate, for digitally sampling at a sample rate the UHF/L-Band analog signal; means, coupled to the analog-to-digital converter and mounted on the substrate, for mixing the digitally sampled signal with a mixing signal thereby shifting the center frequency of the tuning frequency range of the sampled signal to the baseband frequency; and means, coupled to the mixing means and mounted on the substrate, for decimation filtering and decimating the mixed signal to obtain a second sample rate lower than the sample rate.

In another aspect, the present invention is a method for receiving and processing a UHF/L-Band analog signal and deriving digitized samples using a monolithic direct digital UHF/L-Band receiver mounted on a substrate, the receiver operating in a tuning frequency range centered at a center frequency and having a baseband frequency, a lower bandedge frequency, and an upper bandedge frequency. The method comprises the steps of: digitally sampling at a sample rate, using an analog-to-digital converter mounted on the substrate, the UHF/L-Band analog signal; mixing, on the substrate, the digitally sampled signal with a mixing signal thereby shifting the center frequency of the tuning frequency range of the sampled signal to the baseband frequency; and decimation filtering and decimating, on the substrate, the mixed signal to obtain a second sample rate lower than the sample rate.

In yet another aspect, the present invention is a system for receiving a UHF/L-Band analog signal and deriving digitized samples, the receiver operating in a tuning frequency range centered at a center frequency and having a baseband frequency, a lower bandedge frequency, and an upper bandedge frequency. The system comprises a bandpass filter for narrowing the bandwidth of the analog signal; a monolithic integrated circuit having an analog-to-digital converter, a heterodyning circuit, and a digital decimation filter, wherein the analog-to-digital converter includes means for digitally sampling at a sample rate the narrowed signal, wherein the heterodyning circuit includes means, coupled to the analog-to-digital converter, for mixing the digitally sampled signal with a mixing signal thereby shifting the center frequency of the tuning frequency range of the digitally sampled signal to the baseband frequency, and wherein the digital decimation filter includes means, coupled to the heterodyning circuit, for decimation filtering the mixed signal to obtain a second sample rate lower than the sample rate; and a fine tuning integrated circuit, coupled to the decimation filtering means, for fine tuning the decimation filtered signal to derive the digitized samples.

It is to be understood that both the foregoing general description and the following detailed description are exemplary and explanatory only and are not restrictive of the invention, as claimed.

The accompanying drawings are included to provide a further understanding of the invention and are incorporated in and constitute a part of this specification, to illustrate the embodiments of the invention, and, together with the description, to serve to explain the principles of the invention.

BRIEF DESCRIPTION OF THE DRAWINGS

FIG. 3A shows an analog signal shaped by a bandpass filter.

FIG. 3B shows the analog signal of FIG. 3A after having been converted to digital by an analog-to-digital converter made in accordance with the present invention.

FIG. 3C shows the digital signal of FIG. 3B after having been shifted to baseband by a heterodyning circuit made in accordance with the present invention.

FIG. 5A is a diagrammatical representation of a decimation filter circuit made in accordance with the present invention for reducing a digital sample rate by a factor of eight.

FIG. 5B is a diagrammatical representation of an integrator cell circuit made in accordance with the present invention as used in the decimation filter circuit of FIG. 5A.

FIG. 5C is a diagrammatical representation of a comb cell circuit made in accordance with the present invention as used in the decimation filter circuit of FIG. 5A.

FIG. 7A is a diagrammatical representation of a decimation filter circuit made in accordance with the present invention for reducing the sample rate of a digital signal by a factor of four.

FIG. 7B is a diagrammatical representation of an integrator cell circuit made in accordance with the present invention as used in the decimation filter circuit of FIG. 7A.

FIG. 7C is a diagrammatical representation of a comb cell circuit made in accordance with the present invention as used in the decimation filter circuit of FIG. 7A.

DETAILED DESCRIPTION OF THE INVENTION

Reference will now be made in detail to the present preferred embodiment of the invention, an example of which is illustrated in the accompanying drawings. Whereever possible, the same reference numbers will be used throughout the drawings to refer to the same or like parts.

In accordance with the present invention, an apparatus and method are provided for receiving UHF/L-Band analog signals and deriving digitized samples at a baseband frequency. The apparatus comprises a substrate, an analog-to-digital converter mounted on the substrate, mixing means mounted on the substrate, and decimation filtering means mounted on the substrate.

Figure 2:
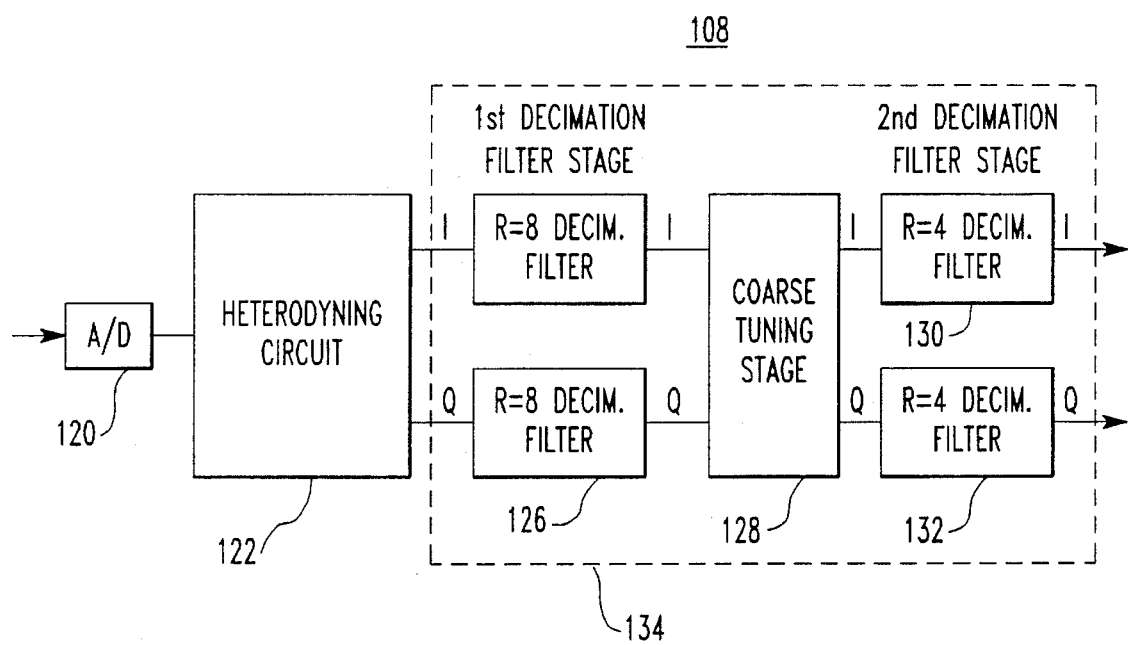
FIG. 2 is a diagrammatical representation of an analog-to-digital converter and digital decimation circuit made in accordance with the present invention for receiving and processing analog UHF/L-Band signals to derive digitized signals at baseband.

An exemplary embodiment of the apparatus of the present invention is shown in FIG. 2 and is designated generally by reference 108.

Figure 1:
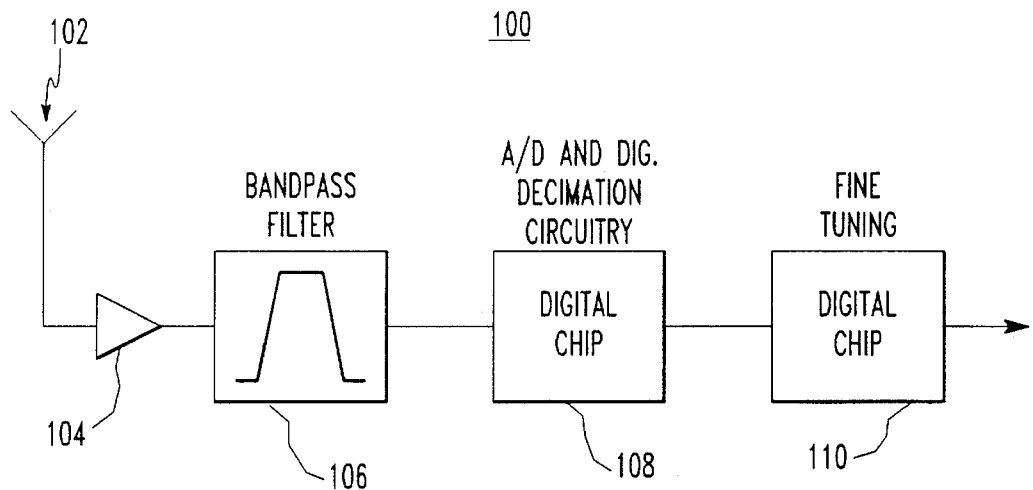
FIG. 1 is a diagrammatical representation of a direct digital receiver for receiving and processing UHF/L-Band signals.

As embodied and shown in FIG. 1, the system of the present invention includes an antenna 102; an amplifier 104; a bandpass filter 106; a monolithic integrated circuit 108 having an analog-to-digital converter and digital decimation filter; and a fine tuning integrated circuit 110. The system receives signals in the UHF/L-Band range, and the analog-to-digital converter and digital decimation filter are both contained on a single integrated circuit chip. The details of this system are described below.

The system of the present invention, as shown in FIG. 1, includes an antenna 102. The antenna 102 is a conventional antenna. Throughout the remainder of this description of the invention, reference will be made to the previous exemplary frequency range, which is applicable to GPS as well as mobile satellite communications systems. The present invention, however, is not limited to such systems, and the principles disclosed herein have a much wider application. For example, the present invention could also be used in a wiring board designed for fighter planes, or in a phased array radar system.

As shown in FIG. 1, the system of the present invention also includes an amplifier 104. The amplifier 104 is a conventional low noise amplifier used to amplify the incoming UHF/L-Band analog signal and prepare it for subsequent processing.

As shown in FIG. 1, the system of the present invention also comprises a bandpass filter 106. As shown in FIG. 3A, the bandpass filter 106 is used to filter the amplified analog signal appropriately around the band of interest prior to digital conversion of the signal.

In accordance with the present invention, the bandpass filtered analog signal is processed by an analog-to-digital converter and digital decimation filter mounted on a single integrated circuit chip 108. As embodied herein, the elements of the converter/filter circuit 108 are shown in FIG. 2, comprising an analog-to-digital converter 120; a heterodyning circuit 122; a first decimation filter stage 124, 126 (one filter section for the in-phase component 124 and one for the quadrature-phase component 126 of the heterodyned digital signal); a coarse tuning stage 128; and a second decimation filter stage 130, 132 (one filter section for the in-phase component 130 and one for the quadrature-phase component 132 of the coarse tuned digital signal). The details of this monolithic integrated circuit chip 108 are described below.

The monolithic integrated circuit 108 includes an analog-to-digital converter 120. As embodied herein, this converter 120 can be a flash-type analog-to-digital converter, which is well-known to those skilled in the art.

In this exemplary embodiment, although the tuning frequency range of the received analog signal is in the gigahertz range (1525 to 1559 MHz), it is not necessary to digitally sample using the analog-to-digital converter 120 at the Nyquist rate of twice the highest frequency, i.e., 3118 MHz. In fact, in this invention, the sample rate can be as low as only twice the bandwidth of the sampled signal; that is, the analog signal can be subsampled. Accordingly, it is only necessary to choose the bandpass filter 106 such that the received analog signal is filtered appropriately around the frequency band of interest 143 before digitally sampling the signal, as shown in FIG. 3A.

Subsampling in this way, however, causes the tuning range to be aliased down to the rate at which the analog-to-digital converter 120 samples the analog signal. Nevertheless, if the sample rate is chosen correctly, such aliasing can be done nondestructively, and in effect achieve downconversion of the sampled signal, centering the tuning frequency range of the signal at baseband.

In accordance with the present invention, it can be shown that destructive aliasing will not occur if the sample rate is chosen as follows:

$$F_{sample} = 2*(F_{lower} + F_{upper})/(2*k+1)$$
$$= 4*F_{center}/(2*k+1)$$

where $F_{sample}$ is equal to the sample rate of the analog-to-digital converter 120; $F_{lower}$ is equal to the lower bandedge frequency of the desired tuning range; $F_{upper}$ is equal to the upper bandedge frequency of the desired tuning range; $F_{center}$ is equal to the center frequency of the desired tuning range; and k is equal to some positive integer. Moreover, using this equation, the sample rate is optimal in that the transition bandwidths of the antialiasing bandpass filter 106 are maximized, i.e., the bandpass filter is the easiest possible to build. This is because the transition bands of the filter 106 (i.e., the bandwidths between the stop and pass frequencies of the filter at both the low and high frequencies framing the passed band) are as wide as possible in the frequencies chosen, namely, 1525 MHz and 1559 MHz. This permits fewer poles in the bandpass filter 106 and/or lower pole Q's; that is, a bandpass filter that is easier to build.

Using this formula, the spectral band of $F_{lower}$ to $F_{upper}$ will appear centered at ¼ of the sample rate if k is even, or at ¾ of the sample rate if k is odd, as shown in FIG. 3B. The arrows pointing from FIG. 3A to FIG. 3B show the conversion of a received signal from the analog frequency domain to the digital frequency domain. In FIGS. 3A and 3B, the negative frequency signal 140 appears centered at ¼ the sample rate ($F_{sample}$), as shown by reference numeral 144, and the positive frequency signal 142 appears centered at ¾ the sample rate, as shown by reference numeral 146.

In accordance with the present invention, and as shown in FIG. 3C, the monolithic integrated circuit 108 also includes a heterodyning circuit 122. Using the heterodyning circuit 122, the tuning range of the digitally sampled signal can be mixed down to baseband, i.e., $F_{center}$ moved to DC. Because the spectral band is centered at ¼ of the sample rate or at ¾ of the sample rate, downconversion is trivial, involving heterodyning the digitally sampled signal by plus/minus ¼ the sample rate. The arrows pointing form FIG. 3B to FIG. 3C show such downconversion, where the sampled signal is heterodyned by +¼ the sample rate. Such heterodyning can be accomplished using a simple digital multiplexing operation, with possible negation.

Figures 4A, 4B:
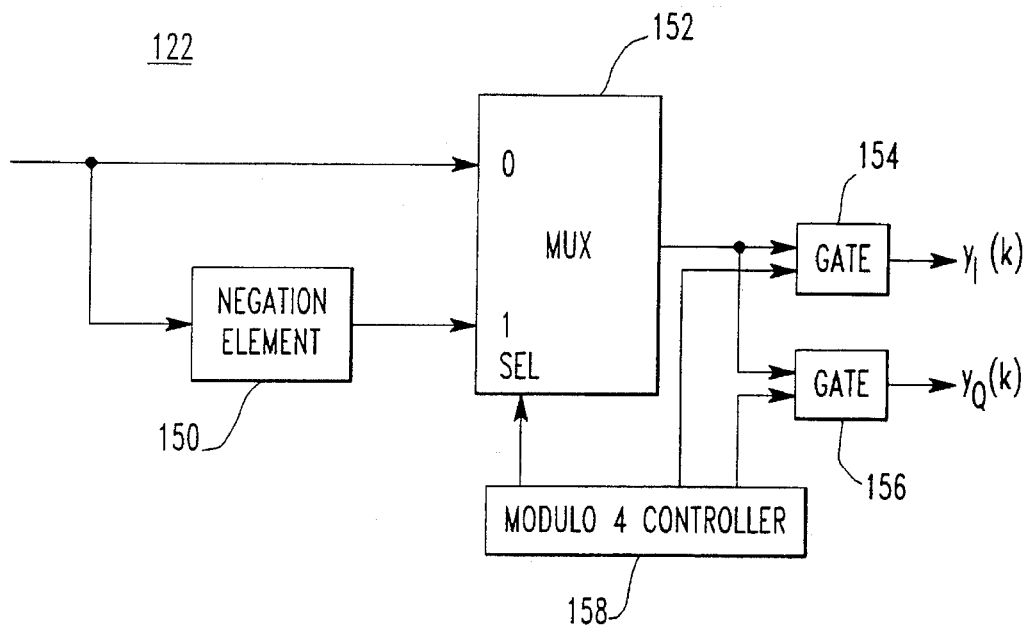
FIG. 4A is a diagrammatical representation of a heterodyning circuit made in accordance with the present invention for shifting a digital signal to baseband frequency and for converting the digital signal into in-phase and quadrature-phase components.
FIG. 4B is a tabular representation of the effect of heterodyning a digital signal using the circuit of FIG. 4A.

As embodied herein and shown in FIG. 4A, the heterodyning circuit 122 includes a negation element 150, a multiplexer 152, two AND gates 154, 156, and a modulo 4 controller 158. Besides mixing the digitally sampled signal down to baseband, this heterodyning circuit 122 also accomplishes transformation of the digitally sampled signal from a single component into in-phase and quadrature-phase components, $y_I(k)$ and $y_Q(k)$.

FIG. 4B shows the mathematical representation of the processing performed by the heterodyning circuit 122, as well as a table illustrating the outputs of the heterodyning circuit for each value of k mod 4. As shown in FIG. 4B, the equation for the output (y(k)) from the heterodyning circuit 122 is:

$$\begin{aligned} y(k)) &= y_I(k) + jy_Q(k) \\ &= x(k)\, e^{-j2\pi(3/4)k} \\ &= x(k)\cos(2\pi(3/4)k) - jx(k)\sin(2\pi(3/4)k) \end{aligned}$$

From this equation, the values for the in-phase ($y_I(k)$) and quadrature-phase ($y_Q(k)$) outputs from the heterodyning circuit 122 can be calculated for each value of k mod 4, as shown in the table in FIG. 4B.

For the exemplary case of the mobile satellite communications application described herein, an appropriate value for $F_{sample}$ is 881.1428571 MHz, which is obtained by setting $F_{lower}$ to 1525 MHz, $F_{upper}$ to 1559 MHz, and k to 3. In order to derive a desired baseband sample rate of 108 kHz, however, $F_{sample}$ is modified to be 884.736 MHz, making the resulting analog-to-digital sample rate exactly an integer multiple of the desired baseband sample rate, 108 kHz. That is, if 884.736 MHz is divided by 108 kHz, the result is the integer 8192. The digital filtering and rate decimation circuitry 124, 126, 128, 130, 132, 110, therefore, is designed to decimate by the integer 8192, thereby deriving the desired baseband sample rate of 108 kHz.

Once the multiplexing operation performed by the heterodyning circuit 122 is performed, the desired tuning range has been downconverted and centered at DC, as shown in FIG. 3C. Therefore, it only remains to reduce the sample rate of the digitally sampled signal to the desired baseband sample rate, to tune the signal to a specific frequency within the tuning range, and to heterodyne the tuned signal to baseband. Because the signal has been digitized, the function of tuning to a specific frequency within the tuning range is a digital signal processing function. Such processing will accept data at the sample rate (in the example disclosed herein, $F_{sample}$ equals 884.736 MHz) and derive baseband samples (in the example disclosed herein, the baseband sample rate of 108 kHz) by digital computation. As a result, enormous throughput rates are required, which, up to now, have been impractical to implement on a single chip. With the advent of VLSI Galium-Arsenide digital technology, however, a viable technology is presently available for implementing digital signal sample rate reduction circuitry, together with an analog-to-digital converter and a heterodyning circuit, on a monolithic integrated circuit 108.

To perform this digital signal sample rate reduction, a decimation filtering circuit 134 is provided to reduce the sample rate of the digitally sampled signal. It is desirable to decimate this signal to a lower sample rate before subsequent processing, because, being narrowband lowpass upon being processed by the heterodyning circuit 122, the signal is greatly oversampled. For the mobile satellite receiver example disclosed herein, the digital signal is oversampled by about 19 times.

As embodied herein and shown in FIG. 2, the decimation filtering circuit 134 includes a first decimation filter stage having a filter 124 for the in-phase component and another filter 126 for the quadrature-phase component; a coarse tuning stage 128; and a second decimation filter stage having a filter 130 for the in-phase component and another filter 132 for the quadrature-phase component. The details of the decimation filtering circuit 134 are described below.

Both decimation filter stages can be implemented using an extremely efficient class of conventional multiplierless digital filters, commonly referred to as Hogenaur filters. See Eugene B. Hogenaur, "An Economical Class of Digital Filters for Decimation and Interpolation," IEEE Transactions on Acoustics, Speech, and Signal Processing, Vol. ASSP-29, No. 2, April 1981, pages 155–62. Hogenaur filters require only adders and are extremely amenable to VLSI implementation.

For the mobile satellite communications system described herein, Hogenaur filters suitable for decimation filtering by factors of 8 and 4 are used, thus achieving an overall composite decimation factor of 32. Of course, for other applications, decimation factors of any value can be obtained using Hogenaur filters, providing a decimation rate of R:1, where R equals some predetermined decimation factor. In the embodiment described herein, R=8 for the 8:1 decimating filter, and R=4 for the 4:1 decimating filter.

The first decimation filter stage 124, 126 is illustrated in FIG. 5A. Each filter 124, 126 includes a cascaded integrator filter section 170 having a number of integrator cells 171; a first register 172 following the cascaded integrator filter section 170; a cascaded comb filter section 173 having a number of comb cells 174; and a second register 176 following the cascaded comb filter section 173.

An example of an integrator cell 171 is shown in FIG. 5B and includes a register 178 and an adder 180. The operation of these integrator cells 171 is well known in the art and is described in the Hogenaur article cited above. In the integrator register 172, the digital signal input from the heterodyning circuit 122, and filtered by the cascaded integrator filter section 170, is subsampled by, as in the example described herein, a factor of 8, thereby effecting an 8:1 rate change. Therefore, in the exemplary embodiment described herein, the sample rate has been reduced from 884.736 MHz to 110.592 MHz.

Figure 8:
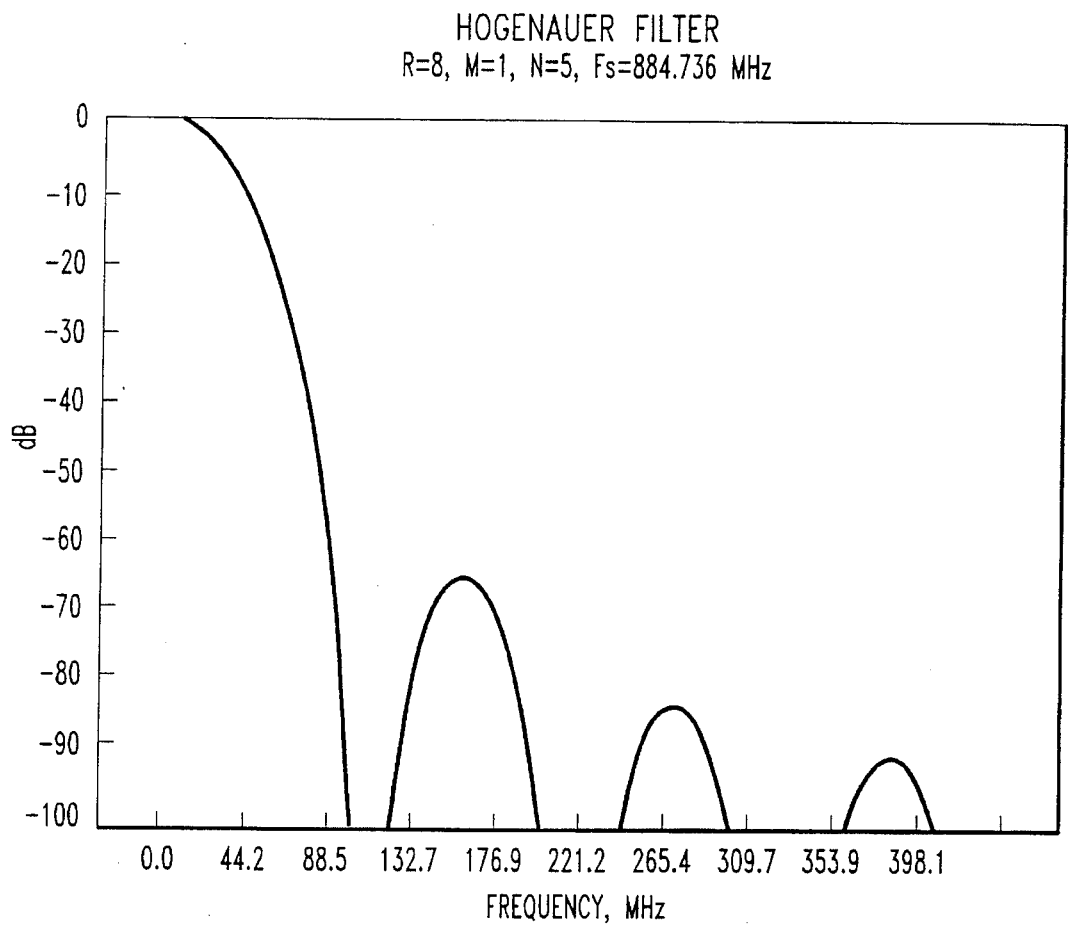
FIG. 8 shows the frequency response of the decimation filter circuit of FIG. 5A.

The subsampled signal then passes through the cascaded comb filter section 173 which subtracts from the subsampled signal any increase in data resulting from the filtering performed by the cascaded integrator filter section 170. Each comb cell 174, as shown in FIG. 5C, includes a register 182, an inverter 184, and an adder 186. Such comb cells are well-known in the art and are described in the Hogenaur article cited above. After passing through the cascaded comb filter section 173, the resulting digital signal is stored in the comb register 176. The frequency response for the first decimation filter stage 124, 126 is shown in FIG. 8.

Figure 6:
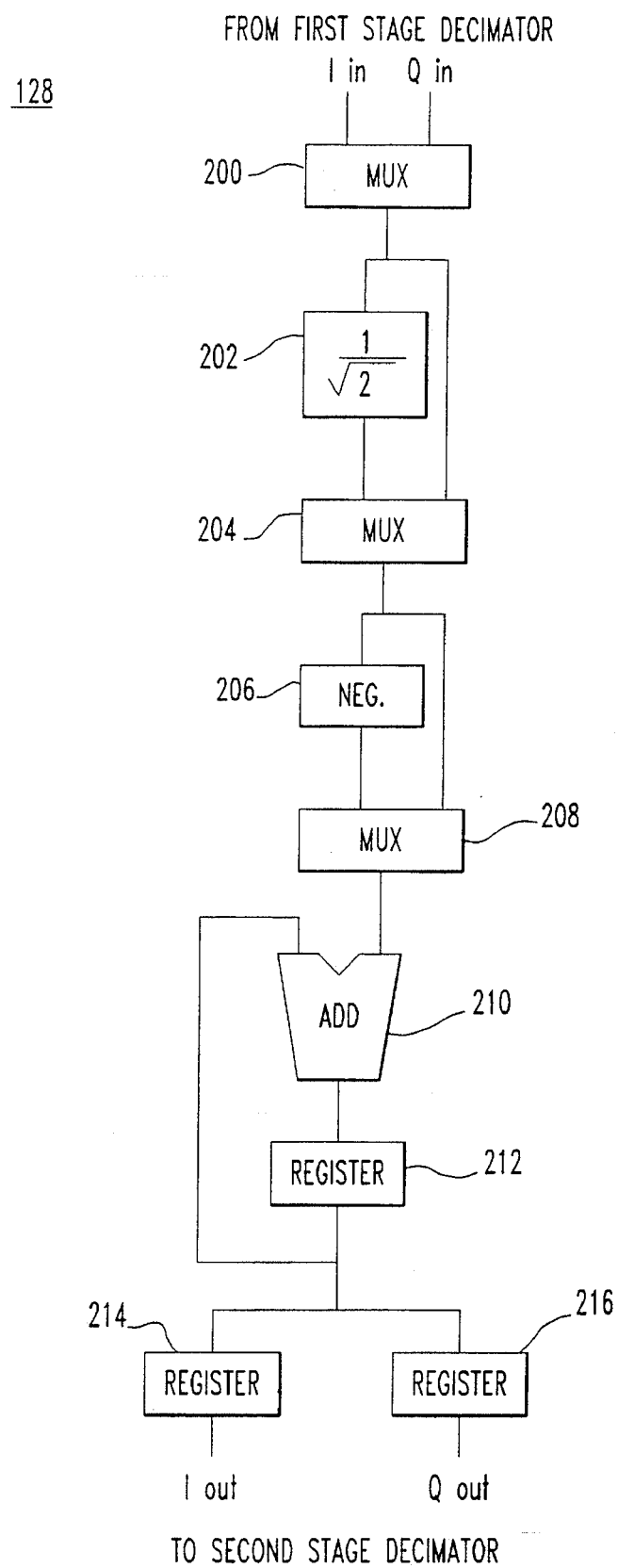
FIG. 6 is a diagrammatical representation of a coarse tuning stage circuit made in accordance with the present invention for tuning a digital signal.

Because the sample rate of the new subsampled signal cannot be reduced further without destructive aliasing occurring somewhere in the 34 MHz tuning bandwidth, a coarse tuning function is performed before the second decimation filter stage 130, 132. An example of a coarse tuning circuit 128 is shown in FIG. 6. As embodied herein, the coarse tuning stage 128 includes a multiplexer 200, a combinational circuit 202, a second multiplexer 204, an inverter 206, a third multiplexer 208, an adder 210, a register 212, a second register 214, and a third register 216. The combinational circuit 202 effects multiplying its input by 1/sqrt(2) without the need of a multiplier. Implementation of the combinational circuit 202 is well-known in the art. As is also well-known in the art, a state machine controller is needed to control the coarse tuning stage 128 in the proper sequence, but is not shown in FIG. 6 for the sake of simplicity. The particular implementation of the coarse tuning stage 128 shown in FIG. 6 is only one of many possible implementations of this function.

Also shown in FIG. 6 are the equations describing the operation of the coarse tuning stage 128 described herein. Each output of the coarse tuning stage 128, Iout and Qout, is derived as follows:

$$(Iout+jQout)_k = (Iin+jQin)_k e^{j2\pi Ik/8},$$

where I=0, 1, ..., 8=the desired tuning increment. Thus, $$Iout_k = Iin_k \cos(2\pi Ik/8) - Qin_k \sin(2\pi Ik/8), \text{ and}$$

$$Qout_k = Iin_k \sin(2\pi Ik/8) + Qin_k \cos(2\pi Ik/8).$$

From these equations, it can be seen that $Iout_k$ and $Qout_k$ each consists of a sum of two terms, each term being +/− I or Q times a sine or cosine of an angle. It can be seen that the sines and cosines of the angle can mathematically can take on only the values of +/−1, +/−1/sqrt(2), or 0. A state machine controller (not shown for simplicity) controls multiplexers 200, 204, 208 in the appropriate way to form all four terms of the quations for $Iout_k$ and $Qout_k$. Register 212 and adder 210, also controlled by the state machine controller, function as an accumulator to add together the two terms making up $Iout_k$. In two clock cycles, both terms of $Iout_k$ are formed and added together by adder 210 and register 212. In two successive clock cycles, $Qout_k$ is similarly formed. Once formed, $Iout_k$ and $Qout_k$ are deposited in output registers 214, 216, respectively.

After the coarse tuning function is performed, the resulting digital signal is decimated a second time. As embodied herein and shown in FIG. 7A, the second decimation filter stage 130, 132 includes a second cascaded integrator filter section 230 having a number of integrator cells 231; a second integrator register 232; a second cascaded comb filter section 233 having a number of comb cells 234; and a second comb register 236. Data from the coarse tuning stage 128 is input to the second cascaded integrator filter section 230, in which it is integrated using a number of integrator cells 231. The operation of the integrator cells 231 is well-known in the art and described in the Hogenaur article cited above. As shown in FIG. 7B, each integrator cell 231 includes a register 238 and an adder 240.

The integrated digital data is then input to the second integrator register 232, where the sample rate of the data is subsampled by a factor of 4, thereby effecting a 4:1 rate change. Therefore, in the exemplary embodiment described herein, the sample rate is further reduced from 110.592 MHz to 27.648 MHz.

Figure 9:
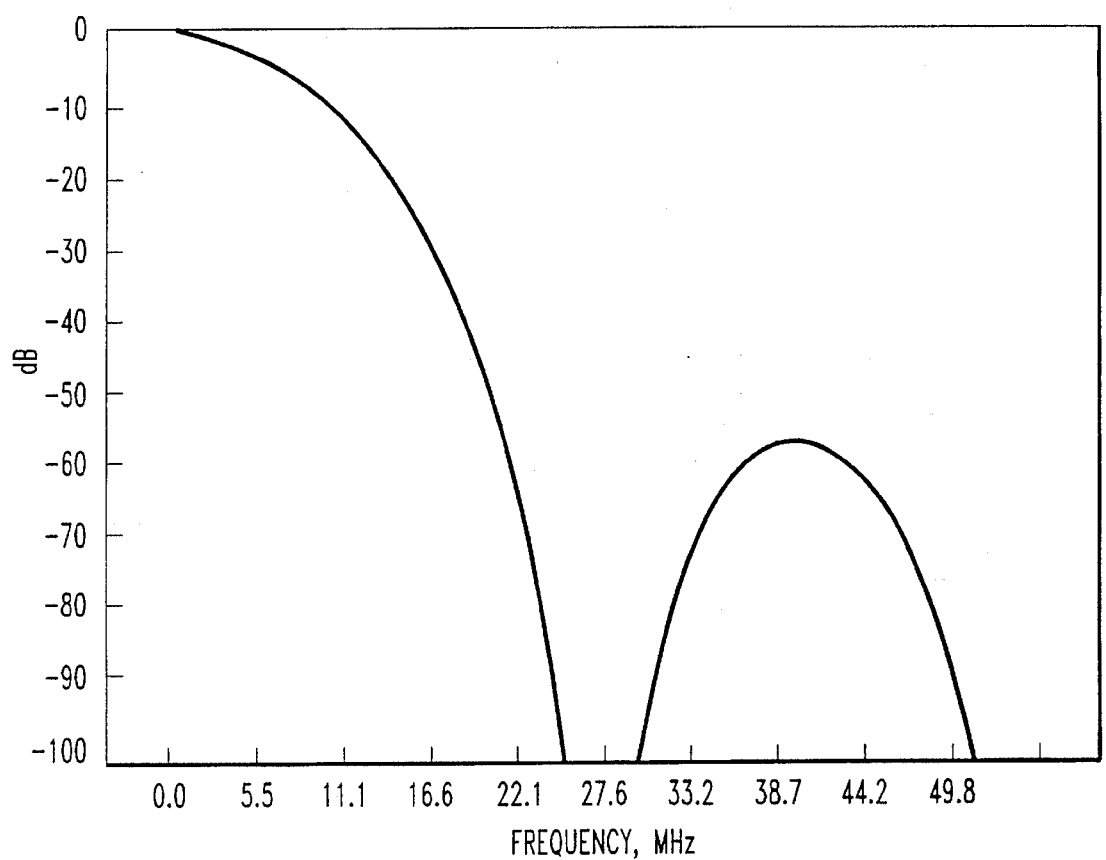
FIG. 9 shows the frequency response of the decimation filter circuit of FIG. 7A.

The subsampled data is then input to the second cascaded comb filter section 233, which includes a number of comb cells 234. Each comb cell 234, as shown in FIG. 7C, includes a register 242, an inverter 244, and an adder 246. The operation of the comb cells is well-known in the art and is described in the Hogenaur article cited above. The combed data is then input to the second comb register 236, from which it is output to the fine tuning integrated circuit 110. The frequency response for the second decimation filter stage 130, 132 is shown in FIG. 9.

Following the second decimation filter stage, the sample rate has been reduced to a point at which current state of the art silicon based digital technology can be used to fine tune the sampled signal and mix it down to baseband. For the mobile satellite communications system application disclosed herein, this sample rate is 27.648 MHz. For such a sample rate, the fine tuning integrated circuit 110 can be implemented with, for example, catalog parts from Harris Semiconductor. Using such parts, a specific frequency within the 13.824 MHz subband can be tuned, and the digital signal can be filtered and decimated down to the desired 108 kHz baseband sample rate.

As embodied herein, the heterodyning circuit 122 and the decimation filter circuit 134 require 25,800 gates. That number is calculated as follows. The heterodyning circuit 122 requires 100 gates; the in-phase 124 and quadrature-phase 126 first decimation stage filters each require 3,100 gates; the coarse tuning stage 128 requires 1,400 gates; the in-phase 130 and quadrature-phase 132 second decimation stage filters each require 2,500 gates; and necessary clocking circuitry (not shown in the FIGS.) takes up 200 gates. Totaling these numbers, it can be seen that 12,900 gates are necessary to implement these functions. Multiplying this number by a factor of two (an estimated factor to overcome fanout, routing, estimation inaccuracies, etc.), results in a grand total of 25,800 gates.

Thus, using a standard 40,000 gate array currently offered by the VITESSE Corporation, a supplier of state of the art digital Galium-Arsenide gate arrays, these circuits can all be mounted on a single chip. The 884.736 MHz operating clock frequency is well within the means of this technology. Moreover, with the unused gates left on such a 40,000 gate array, an analog-to-digital converter of the required performance can be integrated on the standard 40,000 gate chip, together with the heterodyning circuit 122 and the decimation filtering circuit 134. As embodied herein, it is possible to utilize a flash-type analog-to-digital converter.

An additional embodiment of the present invention will now be described where like or similar parts are identified throughout the drawings by the same reference characters. This additional embodiment of the apparatus of the present invention is shown in FIG. 10 and is designated generally by reference numeral 300.

Figure 10:
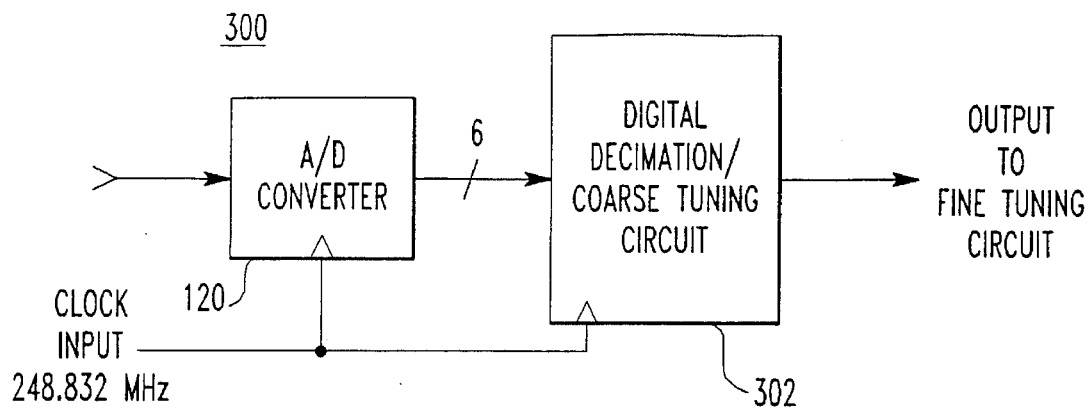
FIG. 10 is a diagrammatical representation of an additional embodiment of the present invention.

As embodied and shown in FIG. 10, the additional embodiment 300 includes an analog-to-digital converter 120 and a digital decimation filtering/coarse tuning circuit 302, both the converter 120 and filtering/tuning circuit 302 mounted on a monolithic integrated circuit chip. The additional embodiment 300 processes signals in the UHF/L-Band range to derive a digitized real output signal having a frequency bandwidth offset from baseband (i.e., 0 Hertz) by ¼ or −¼ of the sample rate of the real output signal. Although the additional embodiment can be built such that the frequency is offset by either ¼ or −¼, as specifically embodied and described herein, the offset is by ¼, not −¼. The analog-to-digital converter 120 is essentially the same as that described above with respect to the first embodiment and outputs real, digitized signals. As shown in FIG. 10, both the analog-to-digital converter 120 and the digital decimation filtering/coarse tuning circuit 302 have clock inputs, the clock preferably operating at 248.832 MHz. The details of this additional embodiment 300 are described below.

Figure 11:
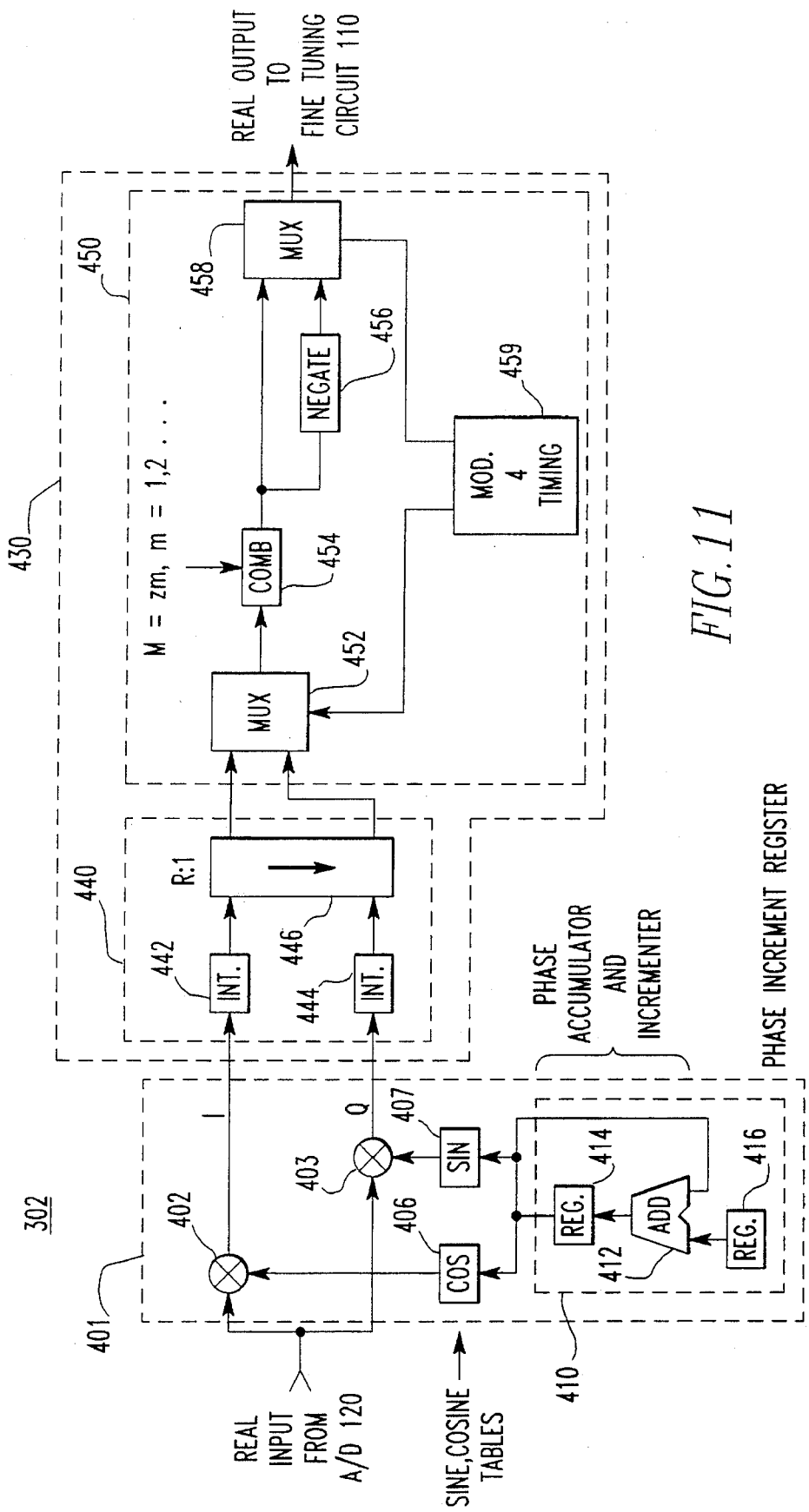
FIG. 11 is a diagrammatical representation, in accordance with the present invention, of the digital decimation filtering/coarse tuning circuit of the additional embodiment.

As shown in FIG. 11, the digital decimation filtering/coarse tuning circuit 302 includes coarse tuning means 401. As embodied herein, the coarse tuning means 401 includes an in-phase multiplier 402 and a quadrature-phase multiplier 403; a cosine lookup table 406 and a sine lookup table 407; and selecting means 410 for selecting values stored in the cosine 406 and sine 407 lookup tables. In accordance with the present invention, the coarse tuning means 401 performs essentially the same function as the heterodyning circuit 122, except that the coarse tuning means 401 is capable of tuning in finer increments than the heterodyning circuit 122. In particular, the heterodyning circuit 122 tunes in increments of ¼ the sample rate of the signal digitally sampled by the analog-to-digital converter 120, whereas the coarse tuning means 401 tunes in increments of ¹⁄₁₂₈ the sample rate of the digitally sampled signal. Accordingly, the coarse tuning frequencies of the additional embodiment 300 are an integer multiple of ¹⁄₁₂₈ the sample rate.

As shown in FIG. 11, the coarse tuning means 401 includes selecting means 410. The selecting means may be of any suitable well-known type, but there is shown by way of example selecting means having an adder 412, an incremental storage register 414, and a select storage register 416. As embodied herein, the incremental storage register 414 is used to store an incremental phase-angle value of an angle along a sine wave representative of a tuning frequency. The incremental value is input to the adder 412, where it is summed with a previous incremental phase-angle value stored in the select storage register 416 and input to the adder 412. The previous incremental phase-angle value is also input to the cosine table 406 and the sine table 407, which, in response, produce the result of the cosine and sine function, respectively, corresponding to that phase-angle value.

The corresponding cosine function result (an in-phase mixing signal) is input to the in-phase multiplier 402, which multiplies the in-phase mixing signal by the digitally sampled signal output from the analog-to-digital converter 120, thereby generating an in-phase mixed signal. Similarly, the corresponding sine function result (a quadrature-phase mixing signal) is input to the quadrature-phase multiplier 403, which multiplies the quadrature-phase mixing signal by the digitally sampled signal output from the analog-to-digital converter 120, thereby generating a quadrature-phase mixed signal. This mixing function also downconverts to baseband the frequency bandwidth of the digitally sampled signal. Each pulse of the clock signal causes the analog-to-digital converter 120 to sample the received UHF/L-Band analog signal and causes the phase-angle value stored in the select storage register 416 to be updated to a new phase-angle value.

As shown in FIG. 11, the digital decimation filtering/coarse tuning circuit 302 also includes digital decimation filtering and decimating means 430. As embodied herein, the decimation filtering and decimating means 430 is a modified Hogenaur-type decimation filter that performs two functions. First, it decimation filters, i.e., it subsamples by a subsample rate the digitally sampled complex signal, as described for the first embodiment. Second, it heterodynes the resulting subsampled complex signal up (or down) in frequency by a quarter of the subsample rate. In contrast with the first embodiment, the digital decimation filtering and decimating means 430 performs decimation filtering and heterodyning in a unique way that reduces the amount of gates required for an unmodified Hogenaur array, such as that described for the first embodiment.

The first embodiment performs the functions of digitally tuning the digitally sampled signal to baseband and then decimation filtering and rate decimating to a lower sampling rate. Because the signal output from the first embodiment is at baseband, both the in-phase and quadrature-phase components are required throughout the circuit, resulting in a complex output signal. If, however, offset baseband is the desired output of the circuit, in which the output frequency spectrum is translated to ¼ or −¼ (equivalently, ¾) of the output sample rate, considerable simplification and gate reduction results.

This can be done, conceptually, by heterodyning the complex output signal up or down in frequency by ¼ of the sample rate, respectively, and then discarding one or the other of the in-phase or quadrature-phase components. The result is a single, real data stream at the output sample rate, rather than a complex data stream. The real data stream will not result in a loss of information because the frequency spectrum of interest will reside at offset baseband due to the offset heterodyning function described above. The mathematical principle behind this is well-known in the art. Having a real data stream is convenient from a hardware point of view because only one set of output data lines is required, and offset baseband data is often what must be provided to the fine tuning circuitry 110 following the decimation circuitry.

Figure 12:
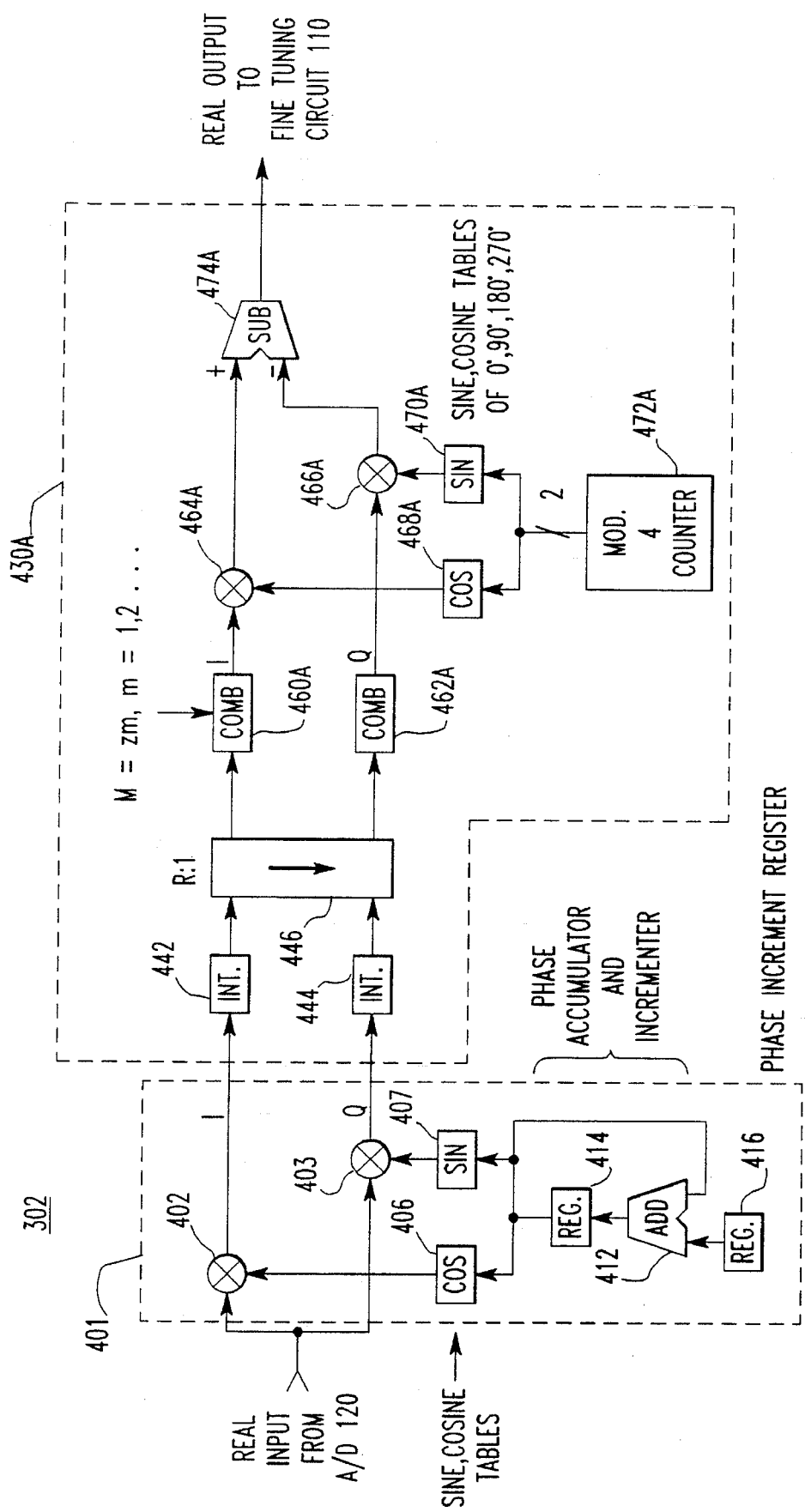
FIG. 12 is a diagrammatical representation of a conceptual implementation of the digital decimation filtering/coarse tuning circuit shown in FIG. 11.

The conceptual representation of this modified Hogenaur digital decimation filtering and decimating means 430A is shown in FIG. 12 and is exactly equivalent to the digital decimation filtering and decimating means 430 shown in FIG. 11. As shown in FIG. 12, the filtering and decimating means 430A has the same integrating means 442, 444 and subsampling means 446 as does the filtering and decimating means 430 shown in FIG. 11.

Unlike the actual implementation of the additional embodiment, however, after subsampling and outputting the complex subsampled signal from the subsampling means. 446, the conceptual implementation of FIG. 12 shows that the in-phase and quadrature-phase components are processed by a pair of comb filters 460A, 462A. Each component is then separately heterodyned using a pair of multipliers 464A, 466A, which mix the combed components with a signal outputted from a cosine lookup table 468A (in-phase) and a sine lookup table 470A (quadrature-phase), from which the cosine and sine values of 0°, 90°, 180°, and 270° are selected using a modulo-4 counter 472A. The mixed in-phase and quadrature-phase components are input to a subtracting circuit 474A, which derives a real output signal to input to the fine tuning circuit 110.

As shown in FIG. 11, and in accordance with the present invention, the exact equivalent of this conceptual implementation is the digital decimation filtering and decimating means 430. As embodied herein, the digital decimation filtering and decimating means 430 includes a subsampling means 440. The subsampling means 440 subsamples (decimates) the complex digital signal output from the in-phase and quadrature-phase multipliers 402, 403 to obtain a subsampled (decimated) complex signal having a subsample rate that is less than the sample rate of the analog-to-digital converter 120. As herein embodied, the second heterodyning circuit 450 generates a real output signal having a frequency bandwidth offset from baseband by ¼ of the subsample rate.

Figure 13:
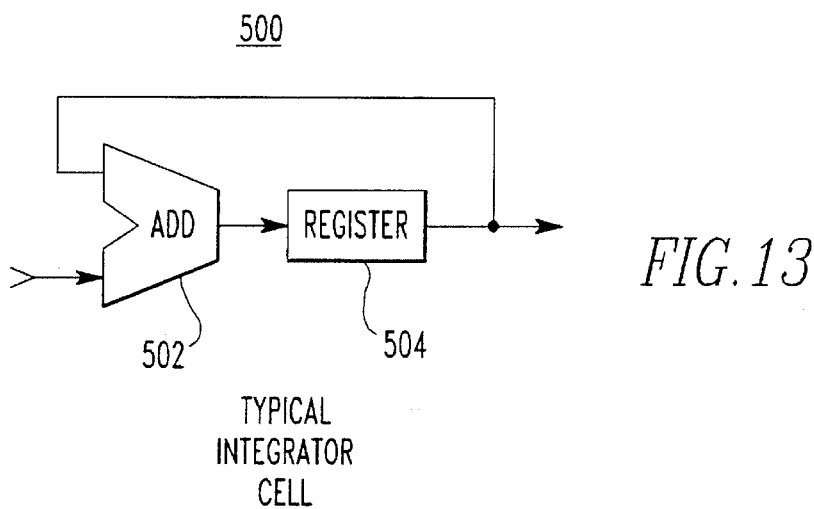
FIG. 13 is a diagrammatical representation of a typical integrator cell used in the additional embodiment of the present invention.

As embodied herein and shown in FIG. 11, the subsampling means 440 includes an in-phase cascaded integrator filter 442, a quadrature-phase cascaded integrator filter 444, and an integrator storage register 446. Respectively, the in-phase and quadrature-phase cascaded integrator filters 442, 444 integrate the in-phase and quadrature-phase components output from the multipliers 402, 403. A typical integrator cell 500 for the cascaded integrator filters 442, 444 is shown in FIG. 13 and, as herein embodied, includes an adder 502 and a register 504. The sample rate of the integrated components is reduced to a subsample rate by the integrator register 446. As described above, the decimation factor assigned to the integrator register is designated R:1 and can be any value of R necessary for the particular application in which the present invention is to be used. For purposes of the additional embodiment 300 described herein, R equals four.

As shown in FIG. 11, the digital decimation filtering and decimating means 430 further includes a second heterodyning circuit 450. As embodied herein, the second heterodyning circuit 450 includes a multiplexer 452, a cascaded comb filter 454, negating means 456, a second multiplexer 458, and a modulo-4 timing circuit 459.

Once decimated by the 4:1 decimation factor, the decimated (subsampled) complex signal having the reduced subsample rate is input to the multiplexer 452. Preferably, the multiplexer 452 is a two-to-one multiplexer, but could be any multiplexer or any other circuit that can accomplish the particular multiplexing function required for this additional embodiment. In accordance with the present invention, the multiplexer 452, in response to an input from the modulo-4 timing circuit 459, which is in turn responsive to the clock pulse, alternately selects between the in-phase and quadrature-phase components of the subsampled complex signal output from the integrator register 446. As a result, the two-to-one multiplexer 452 outputs a signal, alternating between the in-phase and quadrature-phase components of the subsampled complex signal.

The alternating signal output from the multiplexer 452 is then input to the cascaded comb filter 454. The cascaded comb filter 454 subtracts from the alternately selected in-phase and quadrature-phase components of the subsampled complex signal any increase in data caused by integrating the coarse tuned (mixed) complex signal using the integrator filters 442, 444.

Figure 14:
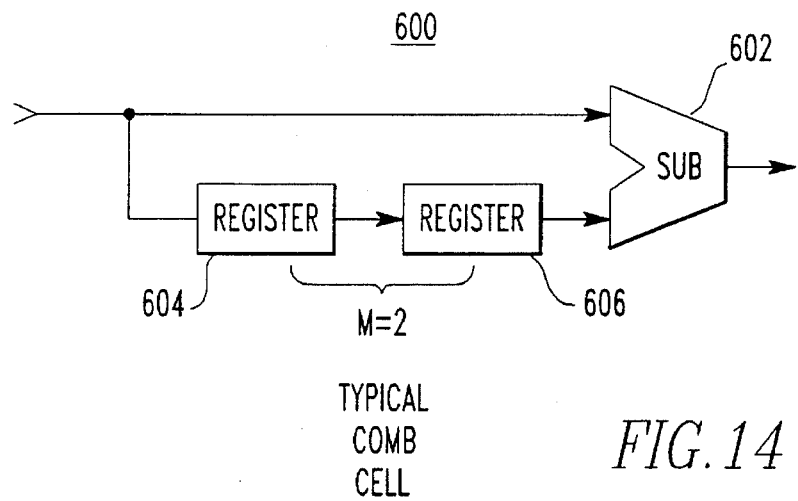
FIG. 14 is a diagrammatical representation, in accordance with the present invention, of a comb cell used in the additional embodiment of the present invention.

The cascaded comb filter 454 has several stages, each stage having a number of comb cells 600, as shown in FIG. 14. The typical comb cell has a subtracting circuit 602 and a number of storage registers. In accordance with the present invention, the number of registers will be equal to M, where $M=2m$, and $m=1, 2, \ldots n$. The number of registers in each comb cell determines the number of delays in the substraction path. As embodied herein, preferably two registers 604, 606 are used in the comb cell 600; thus, M=2 and m=1. By setting M equal to an even number (two or greater) for the cascaded comb filter array 454, i.e., an even number of delays in the subtraction path rather than an odd number of delays, then the additional embodiment requires only one of the two cascaded comb filters 173 (or, equivalently, 233) required in the first embodiment (i.e., one each for the in-phase and quadrature-phase components). Indeed, as can be seen in FIG. 2, in the first embodiment a cascaded comb filter 173 (or 233) is present in each of the decimator filter stages 124, 126, 130, 132. Therefore, the additional embodiment 300 eliminates not only either the in-phase or quadrature-phase component cascaded comb filter of the first embodiment; it also dispenses with the need to have both the first 124, 126 and second 130, 132 decimation stages.

Accordingly, the gate count for this additional embodiment will be considerably less than that for the first embodiment, which, as described above, requires 25,800 gates. In fact, this additional embodiment will fit on a monolithic 20,000 gate array which is an off-the-shelf, commercially available chip and thus need not be custom made.

The subtracted signal output from the cascaded comb filter 454 is then split into two separate paths. One path leads directly to the second multiplexer 458, and the other path leads to the negating means 456, where the subtracted signal is negated and then input to the second multiplexer 458. The second multiplexer, in response to the modulo-4 timing circuit 459, selects between the negated and non-negated subtracted signals. The resulting selected signal is a real signal, which is then input to the fine tuning circuit 110.

The operation of the second heterodyning circuit 450 can be explained mathematically and by reference to the conceptual implementation shown in FIG. 12. For example, take the case where the output signal is to be heterodyned up to ¼ the subsample rate and the real part is to be retained. (The same principles will apply to other cases, of course, for example, heterodyning the output signal down by −¼ the subsample rate.)

If $I(n)+jQ(n)$ is the complex output of an unmodified Hogenaur decimation filter, then heterodyning it up to ¼ of the subsample rate (as embodied herein) produces:

$$\begin{aligned}(1)\quad y(n) &= [I(n)+jQ(n)]\, e^{j(2\pi/4)n} \\ &= [I(n)\cos((2\pi/4)n) - Q(n)\sin((2\pi/4)n)] + \\ &\quad j[Q(n)\cos((2\pi/4)n) + I(n)\sin((2\pi/4)n)]\end{aligned}$$

where I=in-phase, and Q=quadrature-phase. From equation (1), it follows that:

$$\begin{aligned}(2)\quad y(n) &= I(n)+jQ(n), &&\text{where: } n \bmod 4 = 0; \\ y(n) &= -Q(n)+jI(n), &&\text{where: } n \bmod 4 = 1; \\ y(n) &= -I(n)-jQ(n), &&\text{where: } n \bmod 4 = 2; \\ y(n) &= Q(n)-jI(n), &&\text{where: } n \bmod 4 = 3.\end{aligned}$$

For example, the output sequence starting at n=0 for equation (2) is:

$$y(0)=I(0)+jQ(0);$$
$$y(1)=-Q(1)+jI(1);$$
$$y(2)=-I(2)-jQ(2);$$
$$y(3)=Q(3)-jI(3). \quad (3)$$

Consequently, the desired real offset baseband output for equation (3) is:

$$Re[y(0)]=I(0);$$
$$Re[y(1)]=-Q(1);$$
$$Re[y(2)]=-I(2);$$
$$Re[y(3)]=Q(3). \quad (4)$$

From these equations, it can be seen that the real offset baseband output consists of alternating I and Q outputs of the original unmodified decimation filter. Potentially, then, only one comb filter array need be used to compute these outputs if I and Q could be multiplexed through it. This can be done if the choice is made of M an even number greater than or equal to 2. It is only necessary to multiplex (alternately select) the I and Q subsampled signals (output from the integrator register 446) into the remaining single cascaded comb filter array 454, and to adjust the algebraic sign of the data output from the cascaded comb filter 454 on a sample by sample basis in the pattern suggested by equation (4).

Figure 15A:
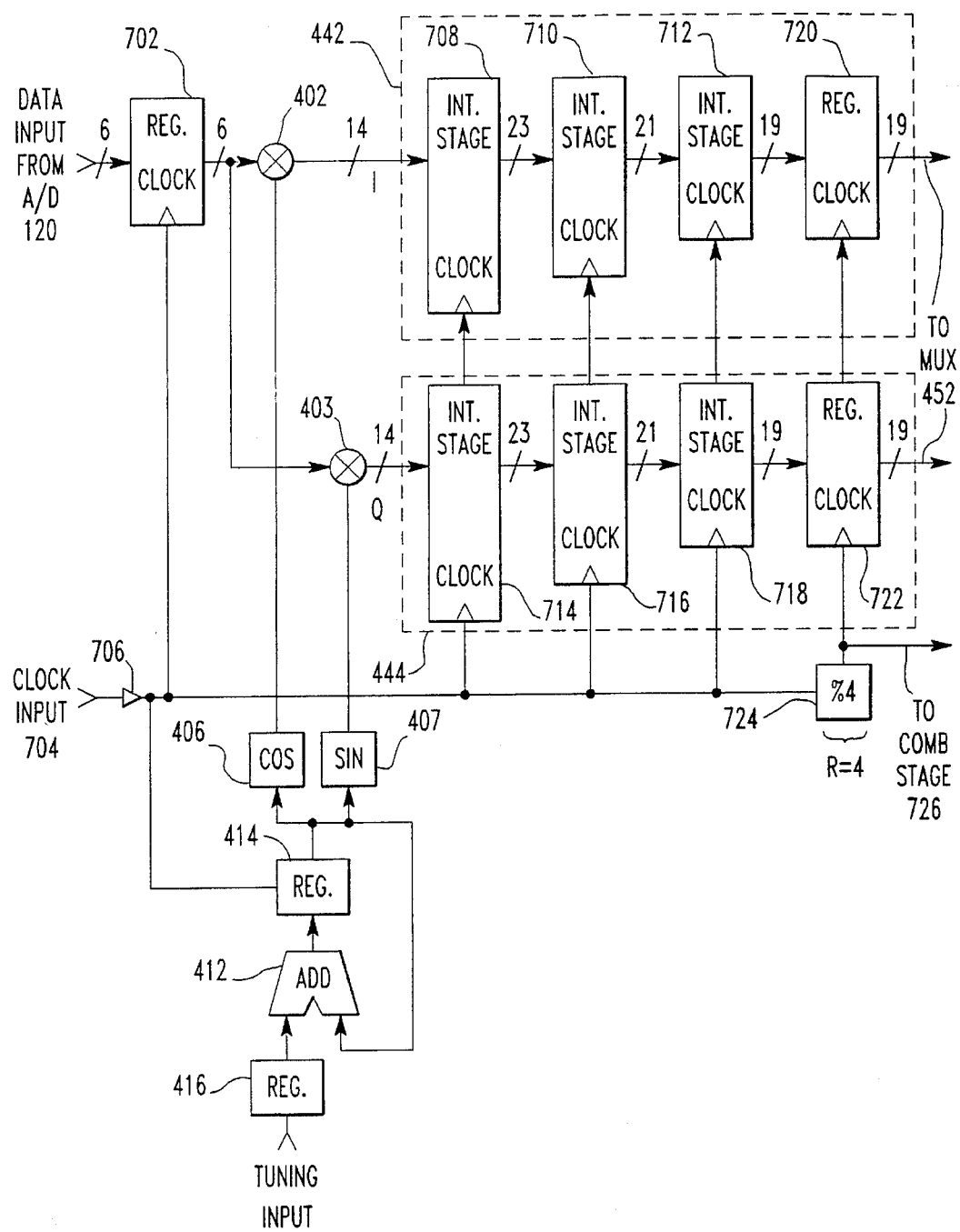
FIGS. 15A and 15B are a diagrammatical representation of the specific embodiment of the additional embodiment of the present invention.
Figure 15B:
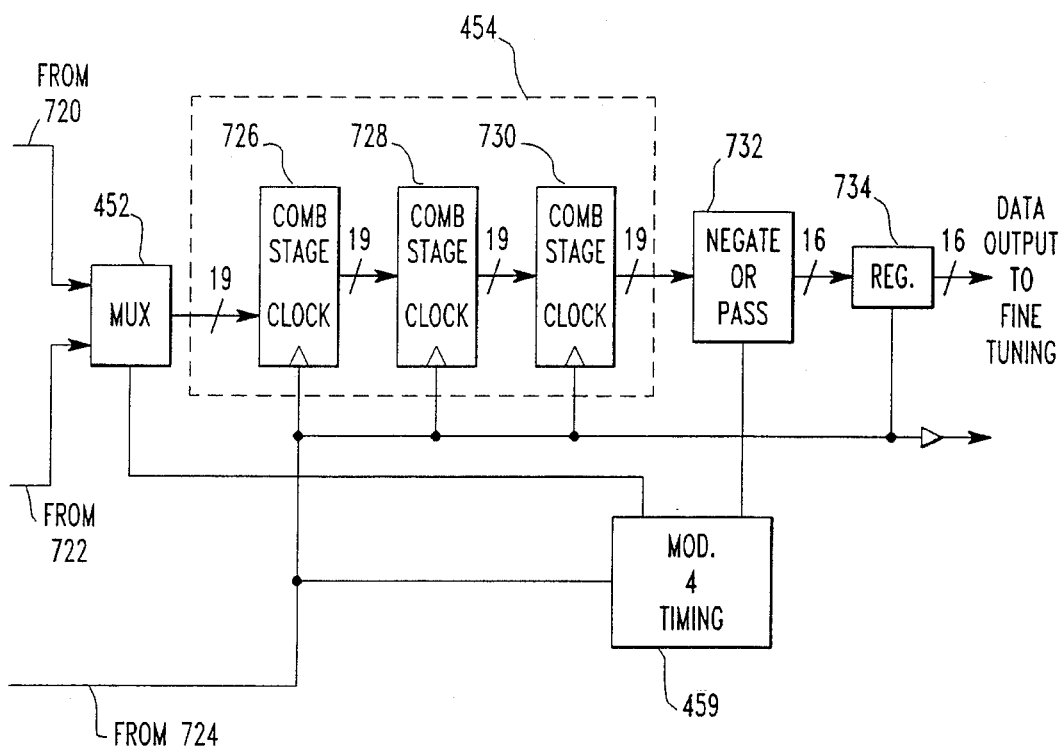

FIG. 15 illustrates the specific embodiment implemented to perform these equations and to obtain the resulting real, offset digitized output signal, showing in more detail the digital decimation filtering/coarse tuning circuit 302 of the additional embodiment 300. As can be seen in FIG. 15, a six-bit data input line from the analog-to-digital converter 120 is coupled to an input register 702, which is responsive to a clock input 704 having a buffer 706. A six-bit output line from the input register 702 is split and coupled to the in-phase multiplier 402 and the quadrature-phase multiplier 403 which, respectively, mix the six-bit output with an eight-bit in-phase coarse tuning (mixing) signal output from the cosine lookup table 406, and with an eight-bit quadrature-phase coarse tuning (mixing) signal output from the sine lookup table 407.

The resulting outputs from the in-phase and quadrature-phase multipliers are fourteen-bit in-phase and quadrature-phase signals, which are input, respectively, to the in-phase and quadrature-phase components of the digital decimation filtering and decimating means 430. As embodied herein and shown in FIG. 15, each integrating means 442, 444 includes three integrator stages, designated 708, 710, 712 on the in-phase side and 714, 716, 718 on the quadrature-phase side. Each of these integrator stages is responsive to the clock signal and functions to integrate the mixed, coarse tuned complex digital signal output from the multipliers 402, 403.

As can also be seen in FIG. 15, the first integrator stage 708, 714 increases the bit-width of the complex signal from fourteen bits to twenty-three bits. The second integrator stage 710, 716 and the third integrator stage 712, 718 both reduce the bit-width of the complex digital signal, the second stage reducing the bit-width from twenty-three to twenty-one bits, and the third stage reducing the bit-width from twenty-one to nineteen bits.

The nineteen-bit integrated complex signal is then input to the integrator register 446, which has an in-phase register 720 and a quadrature-phase register 722. As embodied herein, these registers 720, 722 are responsive to a dividing circuit 724 that is, in turn, responsive to the clock input 704. The dividing circuit 724 functions to output a signal to the registers 720, 722, which subsample (decimate) the complex digital signal to the subsample rate which is lower than the sample rate of the analog-to-digital converter 120.

Output from the registers 720, 722 is a nineteen-bit decimated (subsampled) complex signal that is input to the two-to-one multiplexer 452. As described above and in accordance with the present invention, the multiplexer 452, in response to the modulo-4 timing circuit 459, alternately selects between the in-phase and quadrature-phase components of the decimated complex signal. The single, selected, nineteen-bit signal output from the multiplexer 452 is input to the cascaded comb filter 454, which has three nineteen-bit stages 726, 728, 730. In accordance with the present invention, each of these three stages includes a nineteen-bit comb cell 600, as shown in FIG. 14.

In response to the clock input 704 and in accordance with the present invention, the second multiplexer 458 and the negating means 456 (shown in FIG. 15 as a negate or pass circuit 732) either negate the selected signal and output it to an output register 734, or permit the non-negated selected signal to pass and be input to the output register 734. This negate or pass function reduces the nineteen-bit selected signal to a sixteen-bit output signal. The sixteen-bit output signal is output to the fine tuning circuit 110 by the output register 734 in response to the clock signal 704.

Figure 16A:
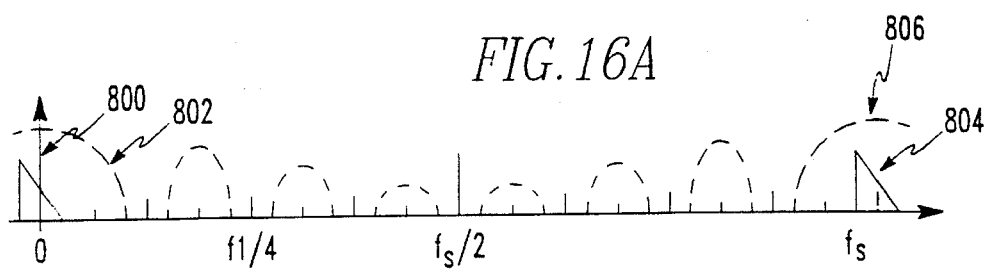
FIG. 16A is a graph showing the frequency spectra after decimation filtering but before subsampling (decimating) in the additional embodiment of the present invention.

FIGS. 16A, 16B, 16C, and 16D, which present frequency spectra, illustrate how the choice in the additional embodiment of M equal to an even number allows in-phase components of even samples and quadrature-phase components of odd samples to share a single set of comb filter hardware. FIG. 16A shows the frequency spectrum after decimation filtering but before the digital complex signal is subsampled (decimated). As can be seen, the original baseband spectrum 800 and decimation filter shape 802 are centered around baseband (i.e., zero frequency), with a second spectrum 804 and decimation filter shape 806 centered around the frequency of the sample rate, $f_s$.

Figure 16B:
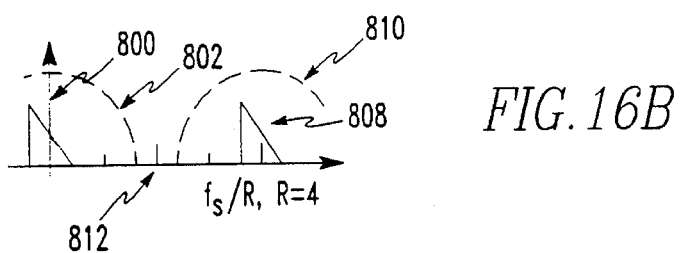
FIG. 16B is a graph showing the frequency spectra after subsampling (decimating) but before heterodyning (offsetting) in the additional embodiment of the present invention.

FIG. 16B shows the frequency spectrum after subsampling (decimation). As in FIG. 16A, the original baseband spectrum 800 and decimation filter shape 802 are centered at baseband, but the second spectrum and decimation filter shape have shifted to $f_s/R$ (R being the subsampling (or decimation) rate), as shown by reference numerals 808 and 810. As embodied herein, R is equal to four. In addition, as shown in FIG. 16B, a notch 812 exists, centered halfway between baseband and the subsample rate frequency, $f_s/R$, that is, centered at ½ $f_s/R$.

Figure 16C:
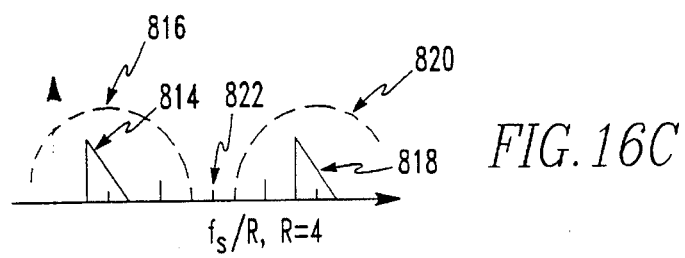
FIG. 16C is a graph showing the frequency spectra after heterodyning (offsetting) but before the real part of the output signal is selected in the additional embodiment of the present invention.

FIG. 16C illustrates the frequency spectrum after heterodyning or offsetting the frequency by ¼ of the subsample rate frequency, $f_s/R$. That is, the frequency spectra and decimation filter shape of both the baseband frequency signal 800, 802 and the second, subsampled frequency signal 808, 810 are shifted by positive ¼ of $f_s/R$. As a result, the offset baseband frequency spectrum 814 and decimation filter shape 816 are centered at a frequency of ¼ $f_s/R$, and the offset second subsampled spectrum 818 and decimation filter shape 820 are centered at a frequency of 1¼ $f_s/R$. The notch 812 is also shifted by positive ¼ of $f_s/R$, resulting in an offset notch 822 centered at ¾ of $f_s/R$.

Figure 16D:
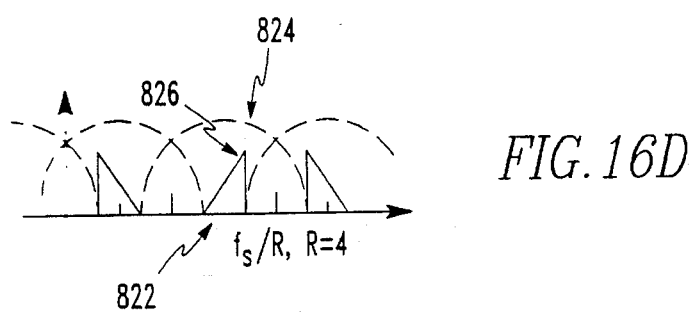
FIG. 16D is a graph showing the frequency spectra of the output signal after selecting the real part in the additional embodiment of the present invention.

The final output signal is shown in FIG. 16D, in which the spectrum is shown after the real part of the complex digitally subsampled and offset signal is taken and the imaginary part discarded. As can be seen in FIG. 16D, a third spectrum 824 and decimation filter shape 826 are aliased into the offset notch 822, resulting in no loss of data due to discarding of the imaginary portion of the complex subsampled and offset signal.

It will be apparent to those skilled in the art that various modifications and variations can be made in the system and method of the present invention without departing from the spirit or scope of the invention. Thus, it is intended that the present invention cover the modifications and variations of this invention provided they come within the scope of the appended claims and their equivalents.

What is claimed is:

1. A monolithic direct digital high frequency receiver for receiving and processing a high frequency analog signal and deriving digitized samples, said receiver operating in a tuning frequency range centered at a center frequency and having a baseband frequency, a lower bandedge frequency and an upper bandedge frequency, said receiver comprising:

a substrate;

an analog-to-digital converter, mounted on said substrate, for digitally sampling at a first sample rate said high frequency analog signal;

a heterodyning circuit, coupled to said analog-to-digital converter and mounted on said substrate, for mixing said digitally sampled signal with a mixing signal to form a mixed signal thereby shifting said center frequency of said tuning frequency range of said sampled signal to said baseband frequency; and means, coupled to said heterodyning circuit and mounted on said substrate, for decimation filtering and decimating said mixed signal by a second sample rate lower than said first sample rate;

wherein the heterodyning circuit includes means for translating the digitally sampled signal into a complex signal having in-phase and quadrature-phase components, wherein the decimation filtering and decimating means includes means, coupled to the heterodyning circuit, for subsampling said complex signal to obtain a subsampled complex signal having a subsample rate lower than the first sample rate;

means, coupled to said subsampling means, for second mixing said subsampled complex signal with a complex coarse tuning signal, said complex coarse tuning signal having an integer submultiple frequency of said subsample rate of said subsampled complex signal; and means, coupled to said means for second mixing said subsampled complex signal, for second subsampling said second mixed complex signal to obtain a second complex subsampled signal having a second sample rate and an output frequency equal to the baseband frequency.

2. The monolithic direct digital high frequency receiver recited in claim 1, wherein the first sample rate is calculated such that:

$$F_{sample} = 2*(F_{lower} + F_{upper})/(2*k + 1)$$
$$= 4*F_{center}/(2*k + 1) \quad ; \text{and}$$

wherein $F_{sample}$ equals the first sample rate, $F_{lower}$ equals the lower bandedge frequency of the tuning frequency range, $F_{upper}$ equals the upper bandedge frequency of the tuning frequency range, $F_{center}$ equals the center frequency of the tuning frequency range, and k equals a positive integer.

3. The monolithic direct digital high frequency receiver recited in claim 2, wherein the mixing signal has either a frequency of ¼ the first sample rate if k is an odd integer, or a frequency of −¼ the first sample rate if k is an even integer.

4. The monolithic direct digital high frequency receiver recited in claim 3, wherein $F_{lower}$=1525 MHz, $F_{upper}$=1571.576 MHz, and K=3.

5. The monolithic direct digital high frequency receiver recited in claim 3, wherein the subsample rate is equal to ⅛ of the first sample rate;

wherein the second sample rate is equal to ¼ of the subsample rate; and wherein the complex coarse tuning signal has a frequency equal to an integer multiple of ⅛ of the frequency of the subsampled complex signal.

6. The monolithic direct digital high frequency receiver recited in claim 1, wherein the mixing means has an input and an output; and wherein the subsampling means includes a cascaded integrator filter for integrating the mixed complex signal, said cascaded integrator filter having an input coupled to the heterodyning circuit and an output.

7. The monolithic direct digital high frequency receiver recited in claim 6, wherein the second subsampling means includes a second cascaded integrator filter for second integrating the second mixed complex signal, said second cascaded integrator filter having an input coupled the output of the mixing means and an output, a second integrator register for second reducing the reduced sample rate of said second integrated complex signal, said second integrator register having an input coupled to said output of said second cascaded integrator filter and an output, a second cascaded comb filter for second subtracting from the second reduced complex signal an increase in data resulting from second integrating the second mixed complex signal, said second cascade comb filter having an input coupled to said output of said second integrator register and an output, and a second comb register for second storing said second subtracted complex signal outputted from said second cascaded comb filter, said comb register having an input coupled to said output of said second cascaded comb filter.

8. The monolithic direct digital high frequency receiver recited in claim 1, wherein the heterodyning circuit includes means for translating the digitally sampled signal into a complex digital signal having in-phase and quadrature-phase samples and means for coarse tuning the complex digital signal; and wherein the decimation filtering and decimating means includes means, coupled to the heterodyning circuit, for subsampling said coarse tuned complex digital signal to obtain a subsampled complex signal having in-phase and quadrature-phase samples and having a subsample rate lower than the first sample rate, and a second heterodyning circuit, coupled to said subsampling means, for generating a real output signal having a frequency bandwidth offset from baseband by ¼ or −¼ of said subsample rate.

9. The monolithic direct digital high frequency receiver recited in claim 8, wherein the mixing signal includes in-phase and quadrature-phase components; and wherein the heterodyning circuit includes means for selecting from a cosine table said in-phase component of said missing signal and for mixing said in-phase component of said mixing signal with the in-phase component of the complex digital signal to obtain an in-phase mixed signal, and means for second mixing said quadrature-phase component of said mixing signal with the quadrature phase component of the complex digital signal, said quadrature-phase component of said mixing signal being selected from a sine table by said selecting means, to obtain a quadrature-phase mixed signal.

10. The monolithic direct digital high frequency receiver recited in claim 9, wherein said selecting means includes a register for storing a phase-shift value and means for accumulating and incrementing said phase-shift value, said phase-shift value being input to the cosine and sine tables to select the in-phase and quadrature-phase components, respectively, of the mixing signal, and wherein the mixing signal has an integer multiple frequency of 1/128 the first sample rate.

11. The monolithic direct digital high frequency receiver recited in claim 8, wherein the subsampling means includes an in-phase cascaded integrator filter and a quadrature-phase cascaded integrator filter for integrating the mixed complex signal; and an integrator register, coupled to said cascaded integrator filters, for reducing the sample rate of said integrated mixed complex signal to the subsample rate.

12. The monolithic direct digital high frequency receiver recited in claim 11, wherein the second heterodyning circuit includes a modulo-4 timing circuit for generating a selecting signal;

a multiplexer, coupled to said integrator register, and responsive to said selecting signal, for alternately selecting the in-phase and quadrature-phase samples of the subsampled complex signal;

A cascaded comb filter, coupled to said multiplexer, for subtracting from said alternately selected in-phase and quadrature-phase samples of the subsampled complex signal any increase in data caused by said in-phase and quadrature-phase cascaded integrator filters;

means, coupled to said cascaded comb filter, for negating said subtracted alternately selected samples; and a second multiplexer, coupled to said cascaded comb filter and to said negating means, and responsive to said selecting signal, for selecting between said negated samples and said alternately selected samples.

13. The monolithic direct digital high frequency receiver recited in claim 12, wherein said cascaded comb filter has a plurality of filter stages, each of said plurality of filter stages having a plurality of comb cells, each of said plurality of comb cells having two delay registers.

14. A method for receiving and processing a high frequency analog signal and deriving digitized samples using a monolithic direct digital high frequency receiver mounted on a substrate, said receiver operating in a tuning frequency range centered at a center frequency and having a baseband frequency, a lower bandedge frequency and an upper bandedge frequency, said method comprising the steps of:

digitally sampling at a first sample rate, using an analog-to-digital converter mounted on said substrate, said high frequency analog signal;

mixing, on said substrate, said digitally sampled signal with a mixing signal to form a mixed signal thereby shifting said center frequency of said tuning range of said digitally sampled signal to said baseband frequency; and decimation filtering and decimating, on said substrate, said mixed signal by a second sample rate lower than said first sample rate to obtain a baseband signal;

wherein the mixing step includes translating the digitally sampled signal into a complex signal having in-phase and quadrature-phase components; and wherein the step of decimation filtering and decimating includes the following substeps:

subsampling said complex signal to obtain a subsampled complex signal having a subsample rate lower than the first sample rate;

second mixing said subsampled complex signal with a complex coarse tuning signal, said complex coarse tuning signal having an integer multiple frequency of said subsample rate of said subsampled complex signal; and second subsampling said second mixed complex signal to obtain a second subsampled complex signal having the second sample rate and an output frequency equal to the baseband frequency.

15. The method recited in claim 14, wherein the first sample rate is calculated as follows:

$$F_{sample} = 2*(F_{lower} + F_{upper})/(2*k + 1)$$
$$= 4*F_{center}/(2*k + 1)$$
; and wherein $F_{sample}$ equals the first sample rate, $F_{lower}$ equals the lower bandedge frequency of the tuning frequency range, $F_{upper}$ equals the upper bandedge frequency of the tuning frequency range, $F_{center}$ equals the center frequency of the tuning frequency range, and k equals a positive integer.

16. The method recited in claim 15, wherein the mixing signal has either a frequency of ¼ the first sample rate if k is an odd integer, or a frequency of −¼ the first sample rate if k is an even integer.

17. The method recited in claim 16, wherein the lower bandedge frequency equals 1525 MHz, the upper bandedge frequency equals 1571.576 MHz, and k equals 3.

18. The method recited in claim 17 wherein the subsample rate is equal to ⅛ of the first sample rate;
, wherein the second subsample rate is equal to ¼ of the subsample rate; and
wherein the complex coarse tuning signal has a frequency equal to an integer multiple of ⅛ of the frequency of the subsampled complex signal.

19. The method recited in claim 14, wherein the subsampling step includes the substeps of: cascade integrator filtering the mixed signal, rate reducing said cascade integrator filtered signal to obtain the subsample rate, cascade comb filtering said signal to remove any increase in data resulting from said cascade integrator filtering step, and storing said cascade comb filtered signal.

20. The method recited in claim 19, wherein the second subsampling step includes the substeps of: second cascade integrator filtering the second mixed complex signal, second rate reducing said second cascade integrator filtered complex signal to obtain the second sample rate, second cascade comb filtering said second rate reduced complex signal to remove any increase in data resulting from said second cascade integrator filtering step, and second storing said second cascade comb filtered complex signal.

21. The method recited in claim 14, wherein the mixing step includes the substep of translating the digitally sampled signal into a complex digital signal having in-phase and quadrature-phase samples; and
wherein the decimation filtering and decimating step includes the substeps of subsampling the mixed complex digital signal to obtain a subsampled complex signal having in-phase and quadrature-phase samples and having a subsample rate lower than the first sample rate, and
generating a real output signal having a frequency bandwidth offset from baseband by ¼ or −¼ of said subsample rate.

22. The method recited in claim 21, wherein the mixing signal includes in-phase and quadrature-phase components; and
wherein the mixing step further includes the substeps of selecting from a cosine table said in-phase component of said mixing signal and mixing said selected in-phase component of said mixing signal with the in-phase component of the complex digital signal to obtain an in-phase mixed signal, and
second selecting from a sine table said quadrature-phase component of said mixing signal and second mixing said selected quadrature-phase component of said mixing signal with the quadrature-phase component of the complex digital signal.

23. The method recited in claim 22, wherein the selecting step and the second selecting step include the substeps of storing a phase-shift value and accumulating and incrementing said phase-shift value, said phase-shift value being input to the cosine and sine tables to select the in-phase and quadrature-phase components, respectively of the mixing signal; and
wherein the mixing signal has an integer multiple frequency of 1/128 the first sample rate.

24. The method recited in claim 21, wherein the subsampling step includes the substep of integrating the in-phase and quadrature-phase components of the mixed complex signal using an in-phase cascaded integrator filter and a quadrature-phase cascaded integrator filter, respectively.

25. The method recited in claim 21, wherein the generating step includes the substeps of:
alternately selecting the in-phase and quadrature-phase samples of the subsampled complex signal;
subtracting from said alternately selected in-phase and quadrature-phase samples of the subsampled complex signal and increase in data caused by the integrating step;
negating said subtracted alternately selected samples; and
selecting between said negated samples and said subtracted alternately selected samples.

26. The method recited in claim 25, further comprising generating a timing pulse; and
wherein the subtracting step includes the substep of delaying by two of said timing pulses the subtracting of the increase in data.

27. A system for receiving a high frequency analog signal and deriving digitized samples, said receiver operating in a tuning frequency range centered at a center frequency and having a lower bandedge frequency and an upper bandedge frequency, said system comprising:
a bandpass filter for narrowing the bandwidth of said analog signal;
a monolithic integrated circuit, operably connected to and for receiving a bandpass filter output, having an analog-to-digital converter, a heterodyning circuit, and a digital decimation filter,
wherein said analog-to-digital converter includes means for digitally sampling at a sample rate said narrowed signal,
wherein said heterodyning circuit includes means, coupled to said analog-to-digital converter, for mixing said digitally sampled signal with a mixing signal thereby shifting said center frequency of said tuning frequency range of said digitally sampled signal to form a mixed signal at said baseband frequency, and
wherein said digital decimation filter includes means, coupled to said heterodyning circuit, for decimation filtering said mixed signal by a second sample rate lower than said sample rate to obtain a decimation filtered signal; and
a fine tuning integrated circuit, operably connected to said monolithic integrated circuit, coupled to said decimation filtering means, for fine tuning said decimation filtered signal to derive said baseband digitized samples.

28. The system recited in claim 27, wherein the decimation filtering means includes means, coupled to the heterodyning circuit, for subsampling the mixed signal to obtain a subsampled signal having a subsample rate lower than the first sample rate;
means, coupled to said subsampling means, for second mixing said subsampled signal with a coarse tuning signal, said coarse tuning signal having an integer multiple frequency of said subsample rate of said subsampled signal; and
means, coupled to said mixing means, for second subsampling said second mixed signal to obtain a second subsampled signal having the second sample rate.

29. The system recited in claim 27, wherein the heterodyning circuit includes means for translating the digitally sampled signal into a complex digital signal having in-phase and quadrature-phase samples and means for coarse tuning the complex digital signal; and wherein the decimation filtering and decimating means includes means, coupled to the heterodyning circuit, for subsampling said coarse tuned complex digital signal to obtain a subsampled complex signal having in-phase and quadrature-phase samples and having a subsample rate lower than the first sample rate, and a second heterodyning circuit, coupled to said subsampling means, for generating a real output signal having a frequency bandwidth offset from baseband by ¼ or −¼ of said subsample rate.

* * * * *